United States Patent
Whetsel

(10) Patent No.: US 7,698,614 B2
(45) Date of Patent: Apr. 13, 2010

(54) SERIAL I/O USING JTAG TCK AND TMS SIGNALS

(75) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 136 days.

(21) Appl. No.: 12/140,404

(22) Filed: Jun. 17, 2008

(65) Prior Publication Data

US 2008/0250282 A1 Oct. 9, 2008

Related U.S. Application Data

(62) Division of application No. 11/051,707, filed on Feb. 4, 2005, now Pat. No. 7,404,128.

(60) Provisional application No. 60/545,704, filed on Feb. 17, 2004.

(51) Int. Cl.
*G01R 31/28* (2006.01)
(52) U.S. Cl. .................................. 714/731; 714/727
(58) Field of Classification Search ............... 714/726, 714/727, 731
See application file for complete search history.

(56) References Cited

U.S. PATENT DOCUMENTS

| | | | | |
|---|---|---|---|---|
| 6,000,051 A | * | 12/1999 | Nadeau-Dostie et al. | 714/727 |
| 6,378,090 B1 | * | 4/2002 | Bhattacharya | 714/724 |
| 6,393,081 B1 | * | 5/2002 | Whetsel | 375/354 |
| 6,988,232 B2 | * | 1/2006 | Ricchetti et al. | 714/736 |
| 7,200,783 B2 | * | 4/2007 | Whetsel | 714/729 |
| 7,284,170 B2 | * | 10/2007 | Whetsel | 714/724 |

OTHER PUBLICATIONS

"IEEE standard test access port and boundary-scan architecture" IEEE Std 1149.1-1990 Publication date Feb. 1990.*

"A method for synchronizing IEEE 1149.1 test access port for chiplevel testability access" by Bhavsar, D. This paper appears in: VLSI Design, 1998. Proceedings., 1998 Eleventh International Conference on Publication Date: Jan. 4-7, 1998 On pp. 289-292 ISSN: 1063-9667 ISBN: 0-8186-8224-8 INSPEC Accession No. 5870449.*

* cited by examiner

*Primary Examiner*—Cynthia Britt
(74) *Attorney, Agent, or Firm*—Lawrence J. Bassuk; W. James Brady; Frederick J. Telecky, Jr.

(57) ABSTRACT

The present disclosure describes a novel method and apparatus of using the JTAG TAP's TMS and TCK terminals as a general purpose serial Input/Output (I/O) bus. According to the present disclosure, the TAP's TMS terminal is used as a clock signal and the TCK terminal is used as a bidirectional data signal to allow serial communication to occur between; (1) an IC and an external controller, (2) between a first and second IC, or (3) between a first and second core circuit within an IC.

4 Claims, 18 Drawing Sheets

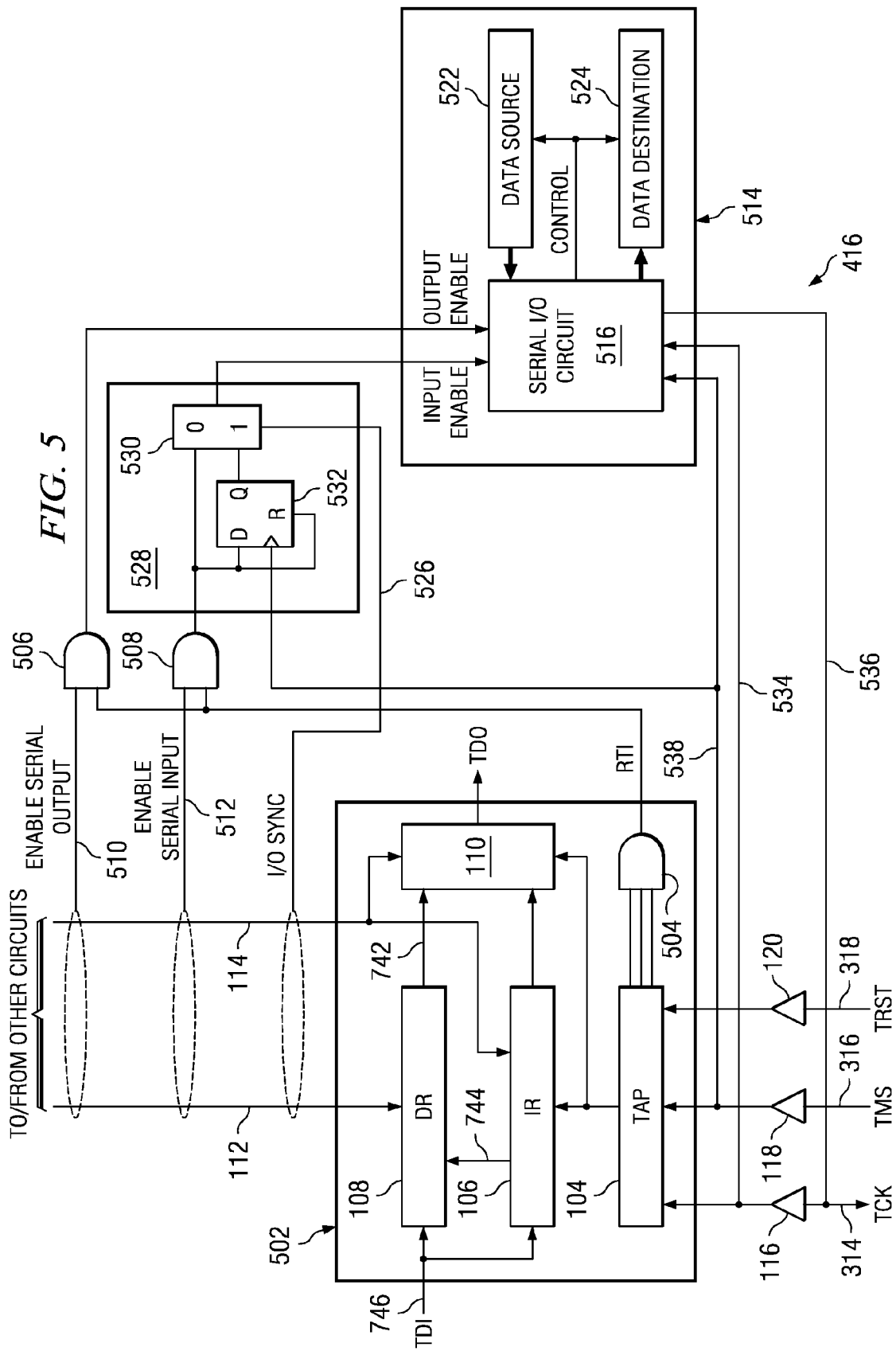

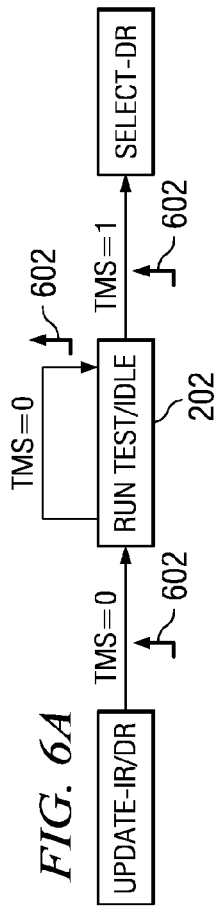
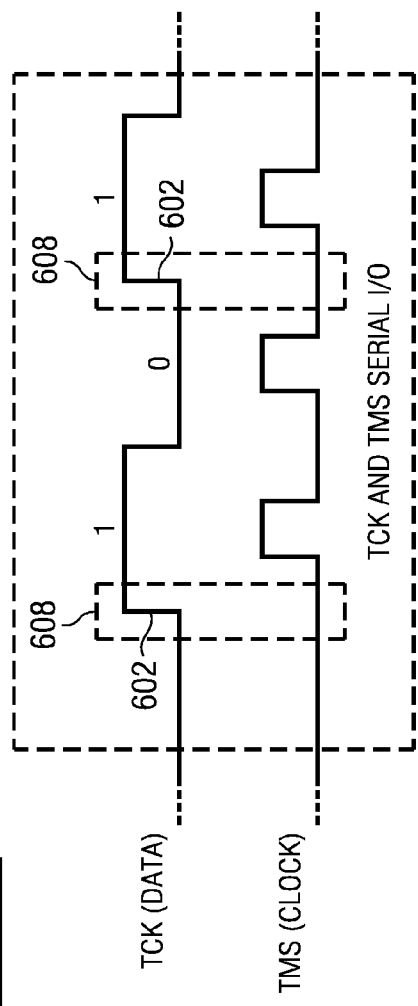
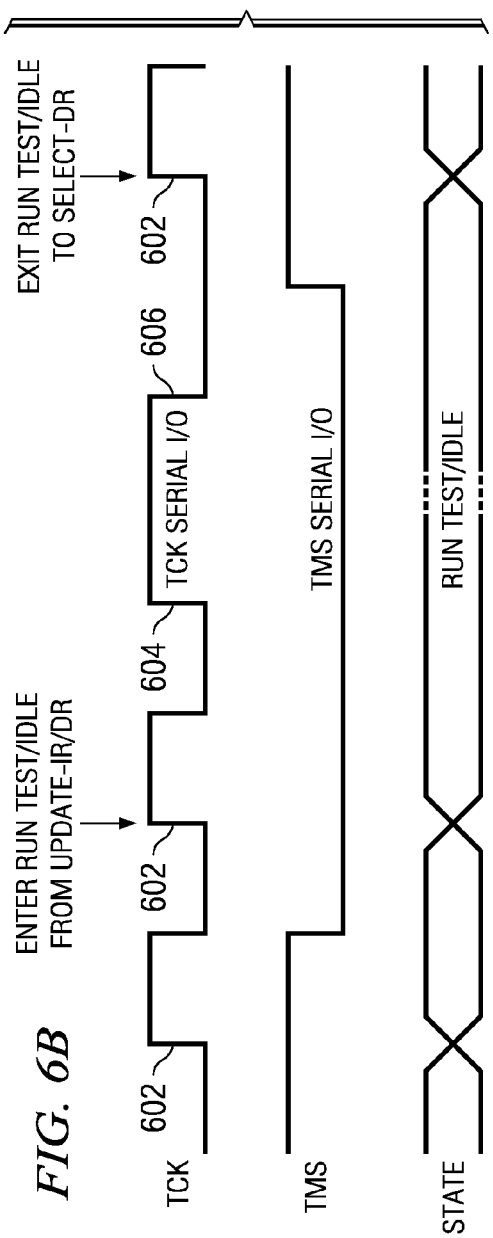
FIG. 6A
FIG. 6C
FIG. 6B

SERIAL I/O USING JTAG TCK AND TMS SIGNALS

This application is a divisional of prior application Ser. No. 11/051,707, filed Feb. 4, 2005, currently pending;

Which claims priority from Provisional Application No. 60/545,704, filed Feb. 17, 2004.

CROSS REFERENCE TO RELATED PATENTS

This application is related to U.S. application Ser. No. 11/015,816, filed Dec. 17, 2004, titled "JTAG Bus Communication Method and Apparatus", U.S. application Ser. No. 10/983,256, filed Nov. 4, 2004, titled "Removable and Replaceable TAP Domain Selection Circuitry", now U.S. Pat. No. 7,200,783, issued Apr. 3, 2007, and U.S. Pat. No. 6,393,081, titled "Plural Circuit Selection Using Role Reversing Control Inputs" all of which are incorporated herein by reference.

FIELD OF THE DISCLOSURE

This disclosure relates in general to circuit design and in particular to improvements in the design of IEEE 1149.1, approved Feb. 15, 1990, TAP interfaces of devices (such as ICs, cores, and/or other circuits) for enhancing communication to and from the devices during operations such as, but not limited too, (1) test operations, (2) debug operations, (3) trace operations, (4) emulation operations, (5) in-system-programming operations, and (6) other, as needed, operations.

BACKGROUND OF THE DISCLOSURE

Today the IEEE 1149.1 (JTAG) Test Access Port (TAP) interface is used for many different applications. While initially designed to provide a serial test interface on ICs to facilitate board testing, the TAP interface now serves as a serial interface for additional IEEE standards for such things as emulation, trace, and debug (IEEE 5001) of ICs and cores, mixed signal testing (IEEE 1149.4) of ICs and cores, advanced IC to IC interconnect testing (IEEE 1149.6), embedded core testing (IEEE 1500), and in-system-programming of circuits in ICs and cores (IEEE 1532).

An IC may contain many embedded 1149.1 based TAP architectures (TAP domains). Some of these TAP domains are associated with intellectual property (IP) core circuits within the IC, and serve as access interfaces to test, debug, trace, emulation, and in-system-programming circuitry within the IP cores. Other TAP domains may exist in the IC which are not associated with cores but rather to circuitry in the IC external of the cores. Further, the IC itself will typically contain a TAP domain for operating IC level test, debug, trace, emulation, and in-system-programming, as well as the boundary scan register associated with the IC's input and output terminals.

From the above, it is clear that TAP domains are being used in ever growing numbers in devices, such as ICs and cores, for test, debug, trace, emulation, in-system-programming, and other types of operations.

The present disclosure describes novel methods and apparatuses for using a TAP Domain's test mode select (TMS) and test clock (TCK) interface terminals as a general purpose serial Input/Output (I/O) bus. According to one aspect, the TMS terminal is used as a clock signal and the TCK terminal is used as a bidirectional data signal to allow serial communication to occur between; (1) an IC and an external controller, (2) between a first and second IC, and (3) between a first and second core circuit within an IC. The use of TMS as a clock signal and TCK as a data signal does not effect the standardized operation of 1149.1 TAP Domains, since the TMS clock and TCK data operations occur when the TAP Domains are in a steady state.

FIG. 1 illustrates a simple example of an IEEE 1149.1 TAP domain 102. The TAP domain includes a TAP controller 104, an instruction register (IR) 106, at least two data registers (DR) 108, and multiplexer circuitry 110. The TAP domain interface consists of a TDI input, a TCK input from an input buffer 116, a TMS input from an input buffer 118, a TRST input from an input buffer 120, and a TDO output.

An input buffer will exist on the TDI input if the TAP Domain is used by itself in an IC or if it is the first TAP Domain in a series of serially connected TAP Domains in an IC. Also an output buffer will exist on the TDO output if the TAP Domain is used by itself in an IC or if it is the last TAP Domain in a series of serially connected TAP Domains in an IC.

In response to TCK and TMS control inputs to TAP controller 104, the TAP controller outputs control to capture data into and shift data through either the IR 106 from TDI to TDO or a selected DR 108 from TDI to TDO. The data shifted into IR 106 is updated and output on bus 114 to other circuits, and the data shifted into a DR 108 is updated and output on bus 112 to other circuits. DR 108 may also capture data from other circuits on bus 112 and IR 106 may capture data from other circuits on bus 114. In response to a TRST input to the TAP controller 104, the TAP controller, IR and DR are reset to known states. The structure and operation of IEEE 1149.1 TAP domain architectures like that of FIG. 1 are well known.

FIG. 2 illustrates the state diagram of the TAP controller 104. All IEEE 1149.1 standard TAP controllers operate according to this state diagram. State transitions occur in response to TMS input and are clocked by the TCK input. The IEEE 1149.1 TAP state diagram is well known.

FIG. 3 illustrates an example scan path system 302 where a number of TAP domain 102 interfaces of ICs 306-312 or embedded cores 306-312 within ICs are connected together serially, via their TDI and TDO terminals, to form a scan path 302 from TDI 304 to TDO 307. Each TAP domain 102 of the ICs/cores 306-312 are also commonly connected to TCK 314, TMS 316, and TRST 318 inputs. The scan path's TDI 304, TDO 307, TCK 314, TMS 316, and TRST 318 signals are coupled to a controller 320, which can serve as a test, debug, trace, emulation, in-system-programming, and/or other application controller. While only four TAP domains 102 of ICs/cores 306-312 are shown, any number of IC/core TAP domains may exist in scan path 302, as indicated by dotted line 322. The scan path 302 arrangement of IC/core TAP domains is well known in the industry.

As seen in FIG. 3, if data is to be input to TAP domain 102 of IC/core 312 from controller 320 it must serially pass through all leading TAP domains of ICs/cores 306-310. Further, if data is to be output from TAP domain 102 of IC/core 306 to controller 320 it must pass through all trailing TAP domains of ICs/cores 308-312. Thus a data input and/or output latency exists between a target TAP domain in scan path 302 and controller 320, due to having to serially traverse intermediate TAP Domains. To further exacerbate the problem, the shifting frequency of the scan path 302 is limited by the slowest shifting TAP domain in the scan path.

For example, if a target TAP domain (i.e. the one where data is to be input to or output from) can shift at 100 MHz, but one or more of the other TAP Domains that need to be serially traversed during the input or output operation can only shift at 10 MHz, the data transfer between the controller 320 and the target TAP domain will be limited to the frequency of the slower TAP domain, i.e. 10 MHz. Due to the above mentioned data latency and shift frequency limitation problems, it is clear that the data communication bandwidth between a target TAP domain and controller 320 is not optimized.

As will be seen later, the present disclosure provides a way to eliminate the above mentioned data latency and shift frequency limitation problems by making use of the direct TMS 316 and TCK 314 connections between the TAP domains of ICs/cores 306-312 and controller 320. Having a direct connection for data input and output between the controller 320 and the TAP domains 102, via the TMS and TCK connections, provides improved data communication bandwidth during test, debug, trace, emulation, in-circuit-programming, and other types of operations. Further, using the direct TCK and TMS connections as a serial bus for data input and output between controller 320 and TAP domains 102 only involves the controller and the targeted TAP domain. Non-targeted TAP domains are not aware of or effected by the direct TMS and TCK communication.

BRIEF SUMMARY OF THE DISCLOSURE

The present disclosure provides a method and apparatus of communicating data between; (1) an IC in a scan path and a controller of the scan path using the TMS and TCK connections that exists between the IC and controller, (2) a first IC of a scan path and a second IC of the scan path using the TMS and TCK connections that exist between the ICs, (3) a first core circuit of a scan path in an IC and second core circuit of the scan path of the IC using the TMS and TCK connections that exist between the cores.

The TMS and TCK data I/O communication occurs while the TAP controller of the TAP domains of the IC/core are in a steady state. Thus the TMS and TCK I/O communication does not disturb or modify the state of TAP domains of the IC/core in a scan path. The TMS and TCK I/O communication is achieved by adding circuitry to the IC/core and coupling the circuitry to the TMS and TCK terminals of the IC's/core's TAP domain.

When enabled by control output from the IC's/core's TAP domain, the added circuitry becomes operable to input data from the TAP domain's TCK terminal in response to a clock signal received at the TMS terminal, or to output data onto the TAP domain's TCK terminal in response to a clock signal received at the TMS terminal. Conventional controllers 320 coupled to the TAP domain's TMS and TCK terminals are improved, according to the present disclosure, such that they are operable to; (1) output clocks on the TMS signal to TAP domains, (2) input data on the TMS signal from TAP domains, and (3) output data on the TMS signal to TAP domains.

BRIEF DESCRIPTION OF THE VIEWS OF THE DRAWINGS

FIG. 5 illustrates serial I/O communication circuitry coupled to a TAP domain according to the present disclosure.

FIG. 6A illustrates the entry into and exit from the TAP controller's Run Test/Idle state.

FIG. 6B illustrates the serial I/O operation of the present disclosure occurring while the TAP controller is in the Run Test/Idle state.

FIG. 6C illustrates the timing of the TCK and TMS signal transitions during serial I/O operations of the present disclosure.

DETAILED DESCRIPTION

Figure 3:
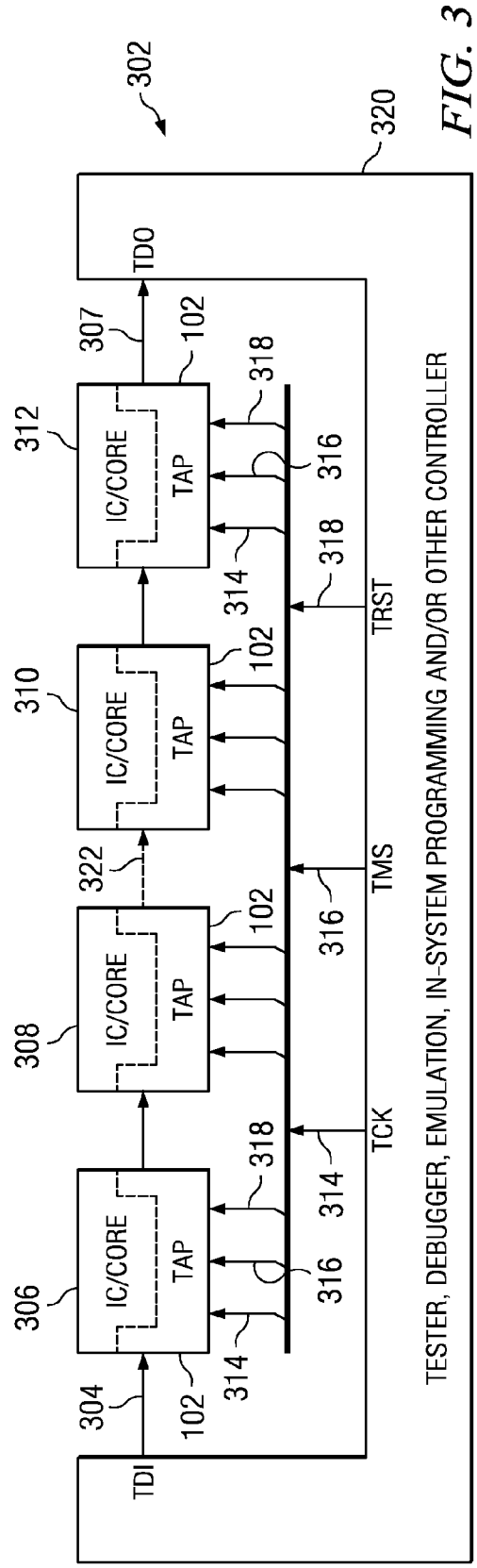
FIG. 3 illustrates a conventional arrangement of ICs or cores within ICs with their TAP domains connected in a scan path and the scan path coupled to a controller.
Figure 4:
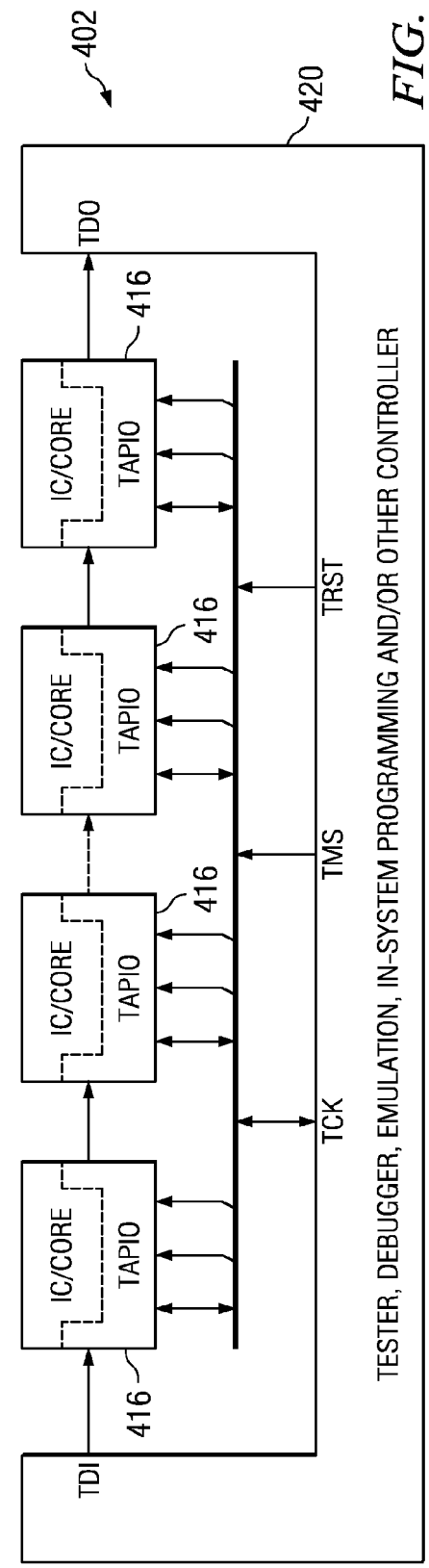
FIG. 4 illustrates the scan path and controller arrangement of FIG. 3 adapted for serial I/O communication according to the present disclosure.

FIG. 4 illustrates a scan path system 402 of ICs/cores that include TAP domains plus additional I/O circuitry. The combination of the TAP domain and I/O circuitry is referred to as TAPIO 416. FIG. 4 is similar to FIG. 3 in regard to the way the TDI, TDO, TCK, TMS, and TRST signals are coupled between the TAPIOs 416 and controller 420. Controller 420 is different from controller 320 in that it has been improved according to the present disclosure to include the capability of communicating data to and from the TAPIOs 416 via the TMS and TCK connections. Controller 420 maintains the conventional capability of controller 320 to communicate to the TAP domains of the TAPIOs 416 using the standard IEEE 1149.1 serial protocol.

As seen in FIG. 4, the TCK connection between controller 420 and TAPIOs 416 is shown as a bidirectional signal path, as opposed to the unidirectional signal path of the TCK connection in FIG. 3. When a TAPIO 416 is selected for sending data to the controller 420 according to the present disclosure, the TCK connection becomes a data output from the TAPIO and a data input to the controller, and the TMS connection becomes a clock output from the controller and a clock input to the TAPIO.

When a TAPIO 416 is selected for receiving data from the controller 420 according to the present disclosure, the TCK connection becomes a data output from the controller and a data input to the TAPIO, and the TMS connection becomes a clock output from the controller and a clock input to the TAPIO. According to the present disclosure, the TMS and TCK connections can be set up to operate as a serial bus with TMS serving as the clock signal for the serial bus and TCK serving as the data input or output signal of the serial bus. As can be seen in FIG. 4, data may be transferred directly between a selected TAPIO 416 and controller 420. Therefore the data latency and shift frequency problems mentioned in regard with FIG. 3 do not exist in FIG. 4.

Additionally, according to the present disclosure, one TAPIO of an IC/core in the scan path 402 may communicate to another TAPIO of an IC/core in the scan path 402 via the TCK and TMS serial bus connections between them. To achieve this mode of operation, the controller 420 selects one TAPIO to transmit and another TAPIO to receive. The controller then disables its TCK output driver so that the transmitting TAPIO can output on its TCK terminal to send data to the TCK terminal of the receiving TAPIO. The controller outputs clocks on TMS to time the data transfer between the transmitting and receiving TAPIOs. Again, the data is directly transferred between the TAPIOs, via the TCK connection, without the aforementioned problems.

FIG. 5 illustrates the TAPIO circuit 416 in more detail. As seen the TAPIO 416 consists of a TAP domain 502, a Serial I/O communication circuit 514, AND gates 506-508, and a Sync Circuit 528. TAP domain 502 is similar to TAP domain 102 with the exception that it includes AND gate 504 for detecting when the TAP controller 104 is in the Run Test/Idle (RTI) state 202 of FIG. 2.

Figure 2:
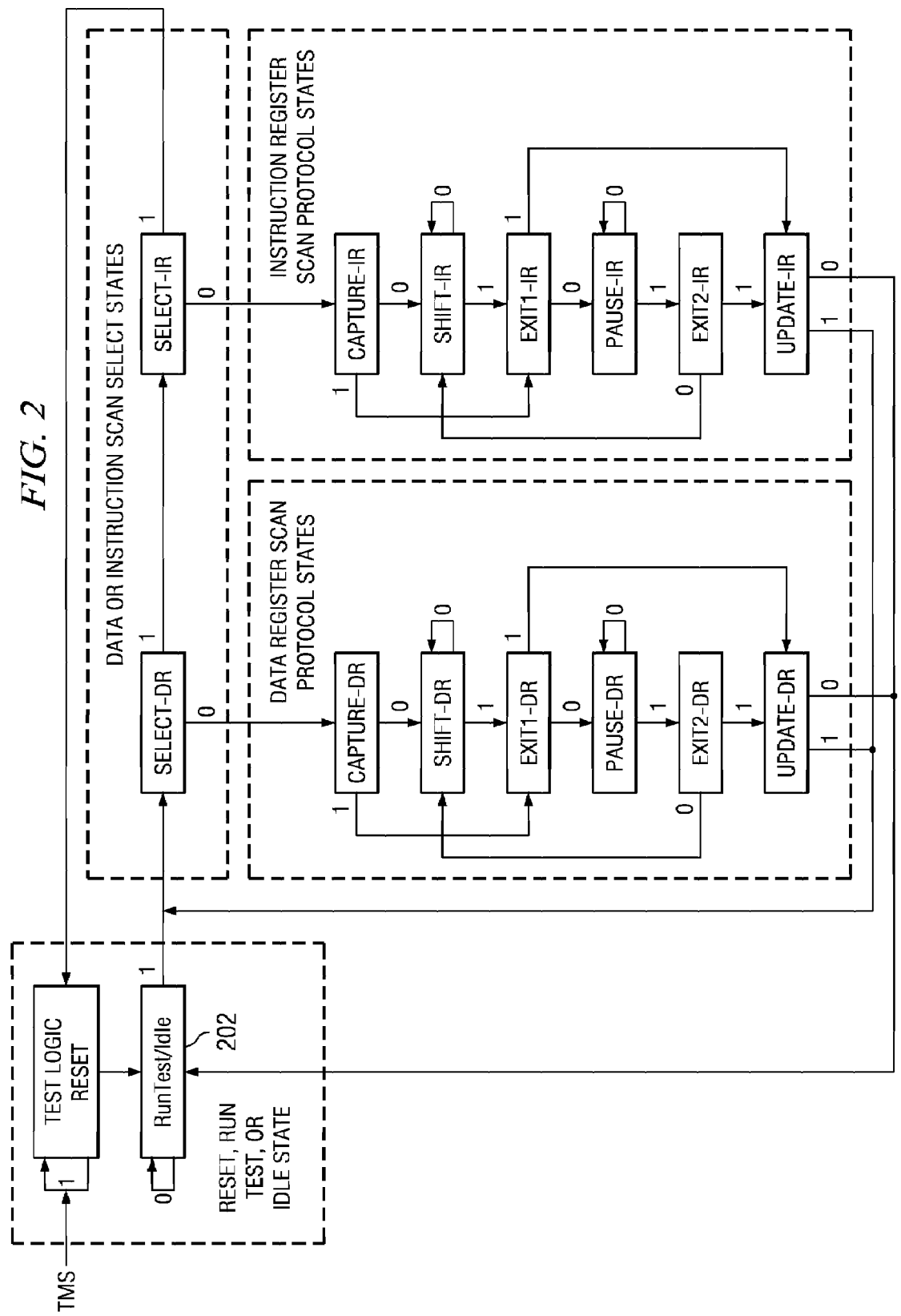
FIG. 2 illustrates the state diagram of a conventional IEEE 1149.1 TAP controller.

The TAP controller 104 is a four bit state machine defining the 16 unique states shown in FIG. 2. Each of the 16 TAP states is defined by a unique one of the four bit state machine codes. While not shown, the four inputs of the AND gate 504 are inverted or not inverted to allow the AND gate to detect, with a logic high output, when the TAP controller 104 is in the Run Test/Idle state. For example, if the Run Test/Idle state has a four bit code of 0101, then the "0" inputs to AND gate 504 will be inverted such that the AND gate will receive all "1's" at its inputs so that it outputs a logic one when the TAP controller is in the Run Test/Idle state. This will be the case throughout the remainder of this specification for all AND gates that are described for use in detecting TAP controller states. Also while AND gates are shown being used to detect TAP controller states, other gating circuits may be used as well.

Further, TAP domain 502 differs from TAP domain 102 in that it includes an Enable Serial Output signal 510, an Enable Serial Input signal 512, and a I/O Sync signal 526. The Enable Serial Output signal is set by a JTAG scan operation whenever the Serial I/O communication circuit 514 is to perform a data output operation on TCK. The Enable Serial Input signal is set by a JTAG scan operation whenever the Serial I/O communication circuit 514 is to perform a data input operation on TCK. The I/O Sync signal is set low when an IC or core within an IC performs a data input operation from the controller 420.

While I/O Sync is low, the output of AND gate 508 is coupled directly, via multiplexer 530 of Sync Circuit 528, to the Input Enable input of the Serial I/O Circuit 516. The I/O Sync signal is set high when an IC performs a data input operation from another IC or when a core within an IC performs a data input operation from another core within the IC.

While I/O Sync is high, the output of AND gate 508 is coupled, via D-FF 532 and multiplexer 530 of Sync Circuit 528, to the Input Enable input of Serial I/O Circuit 516. The purpose and operation of the I/O Sync signal 526 and Sync Circuit 528 will be described in more detail later in regard to FIG. 16. As seen, the Enable Serial Input, Enable Serial Output, and I/O Sync signals can come, by design choice, from either the IR 106 via bus 114 or from a DR 108 via bus 112.

When Enable Serial Output is set high and when the TAP controller 104 is in the Run Test/Idle (RTI) state 202, the output of AND gate 506 will go high to enable the Serial I/O communications circuit 514 to perform a serial TCK output operation. When Enable Serial Input is set high and when the TAP controller 104 is in the Run Test/Idle (RTI) state, the output of AND gate 508 will go high to enable the Serial I/O communications circuit 514 to perform a serial TCK input operation.

If the I/O Sync signal is low, the high output of AND gate 508 will immediately set the Input Enable input of Serial I/O Circuit 516 high via multiplexer 530. If the I/O Sync signal is high, the high output of AND gate 508 will set the Input Enable input of Serial I/O Circuit 516 high following the first rising edge of a clock input on the TMS signal 316. As seen in Sync Circuit 528, when I/O Sync is high, the input from AND gate 508 must be clocked into D-FF 532 on the rising edge of the TMS clock before being output from multiplexer 530 to the Input Enable input of Serial I/O Circuit 516. During serial TCK input or output operations, the controller 420 outputs a clock on TMS to time the serial operations. Also during either the serial TCK input or output operations, the TAP controller 104 remains in the Run Test/Idle state 202.

Serial I/O communication circuit 514 consists of a Serial I/O Circuit 516, a Data Source circuit 522, and Data Destination circuit 524. The Serial I/O Circuit 516 receives the Input Enable signal from AND gate 508 (via Sync Circuit 528), the Output Enable signal from AND gate 506, a TCK 314 data input signal via connection 534 during serial input operations, parallel data input signals from Data Source circuit 522, and a TMS 316 clock input signal via connection 538. The Serial I/O Circuit 516 outputs a TCK 314 data output signal via connection 536 during serial output operations, parallel data output signals to Data Destination circuit 524, and control signals to the Data Source 522 and Data Destination 524 circuits.

When enabled for inputting data from TCK (Input Enable signal set high), the Serial I/O Circuit 516 is clocked by TMS 316 to receive serial TCK 314 data via connection 534 and transfer it in parallel to the Data Destination circuitry 524. Data Destination circuitry 524 may be any circuitry within an IC including but not limited to; (1) an address bus, (2) a data bus, (3) a Ram memory, (4) a Cache memory, (5) a register file, (6) a FIFO, (7) a register, (8) a processor, (9) a peripheral circuit, or (10) a bus coupled to circuitry external to the IC.

When enabled for outputting data on TCK (Output Enable signal set high), the Serial I/O Circuit 516 is clocked by TMS 316 to receive parallel data from the Data Source circuitry 522 and output the data serially on TCK via connection 536. Data Source circuitry 522 may be any circuitry within an IC including but not limited to; (1) an address bus, (2) a data bus, (3) a Ram memory, (4) a Rom memory, (5) a Cache memory, (6) a register file, (7) a FIFO, (8) a register, (9) a processor, (10) a peripheral circuit, or (11) a bus coupled to circuitry external to the IC. The Data Destination 524 and Source 522 circuits may be functional circuits, test circuits, debug circuits, trace circuits, emulation circuits, in-system programming circuits, or mixtures of these and/or other circuit types.

FIG. 6A illustrates a portion of the TAP controller state diagram of FIG. 2 whereby the TAP controller 104 is seen to transition to and remain in the Run Test/Idle state 202. FIG. 6B illustrates a TCK and TMS timing diagram relating to the state transitions in FIG. 6A. The TAP controller samples the logic value of TMS on the rising edge 602 of TCK to transition between its states. As seen in FIGS. 6A and 6B, the TAP controller will transition from either the Update-DR or Update-IR state to the Run Test/Idle state on the rising edge of TCK when TMS is at a logic zero. The TAP controller will remain in the Run Test/Idle state during each rising edge of TCK if the rising edge occurs while TMS is at a logic zero. The TAP controller will transition from the Run Test/Idle state to the Select-DR state if TMS is a logic one during the rising edge of TCK.

In FIG. 6B it is seen that while the TAP controller is in the Run Test/Idle state, the TCK and TMS serial I/O operation of the present disclosure may be executed between times 604 and 606. During the execution, TCK serves as either a serial data input to the TAPIO or a serial data output from the TAPIO, while TMS serves as a clock input to the TAPIO for timing the serial data. To prevent the serial data input or output operation of the present disclosure from causing a change of state in the TAP controller (i.e. causing the TAP controller to transition out of the Run Test/Idle state which would terminate the serial I/O operation) the timing of the TCK clock and TMS data must be orchestrated such that each rising edge of TCK data occurs only when the TMS clock is at a logic zero state.

FIG. 6C illustrates a portion of a serial data input or output operation occurring between times 604 and 606 of FIG. 6B. In this portion, a serial data stream of "101" is shown being transferred on TCK while a clock is applied on TMS. As mentioned above, the timing of the TCK data and TCK clock signals are orchestrated, as seen at times 608 of FIG. 6C, such that during each rising edge of a TCK data signal the TMS clock signal is at a logic low state. Such timing orchestration of the TCK data and TMS clock signals insures that the TAP controller 104 will remain in the Run Test/Idle state 202 during each rising edge 602 of a TCK data signal, since the value on the TMS clock signal will be a logic low.

Use of this timing scheme on TCK and TMS by the present disclosure prevents the TAP controller from being effected by the serial I/O operation taking place on the TCK and TMS serial bus. When the TAPIO is receiving serial data from the controller 420, the controller provides the TCK and TMS signal timing of FIG. 6C. When the TAPIO is outputting serial data to the controller 420 or to another TAPIO, the Serial I/O circuit 516 of the outputting TAPIO provides the TCK and TMS signal timing of FIG. 6C.

Figure 7:
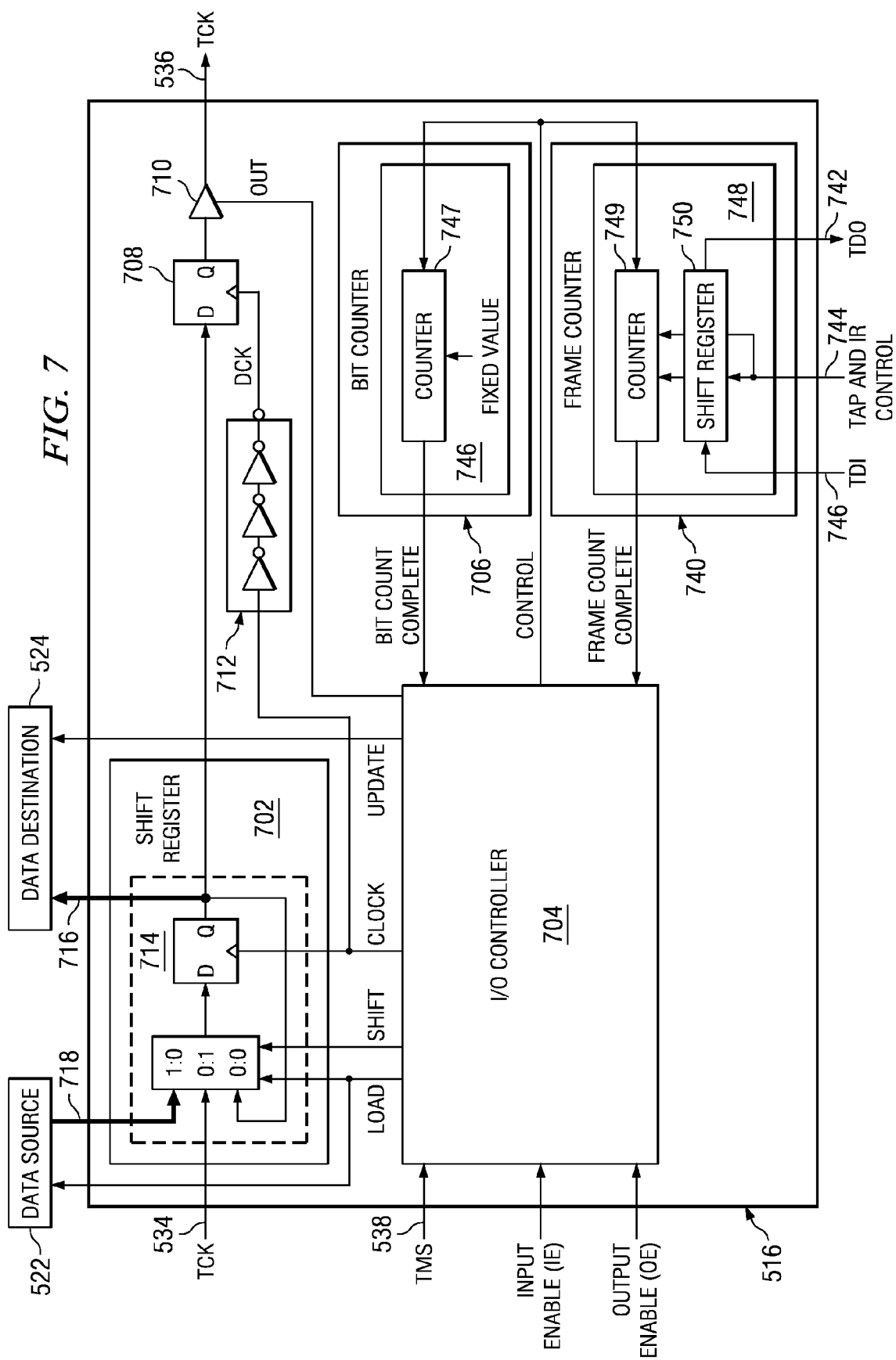
FIG. 7 illustrates the Serial I/O Circuit of the present disclosure.

FIG. 7 illustrates an example of a Serial I/O Circuit 516 in more detail. The Serial I/O Circuit of this example consists of a shift register 702, an I/O controller 704, a bit counter 706, a frame counter 740, an output D-FF 708, a 3-state buffer 710, and a delay circuit 712. The I/O controller 704 inputs the TMS 316 signal via connection 538, the Input Enable (IE) signal from AND gate 508 (via Sync Circuit 528), the Output Enable (OE) signal from AND gate 506, a bit count complete (BCC) signal from bit counter 706, and a frame count complete (FCC) from frame counter 740.

The I/O controller outputs an Update signal, a Shift signal, a Clock signal, a Load signal, an Out signal, and bit and frame counter control signals. The shift register has a serial input coupled to TCK 314 via connection 534, a serial output coupled to the input of D-FF 708, control inputs coupled to the Shift, Clock, and Load output signals from I/O controller 704, a parallel output bus 716 coupled to Data Destination 524, and a parallel input bus 718 coupled to Data Source 522.

The bit counter 706 receives control inputs from I/O controller 704 and outputs a bit count complete (BCC) signal to I/O controller 704. The frame counter 740 receives control input from I/O controller 704, an input from TDI 746 of TAP domain 502, and control inputs 744 from the TAP controller and instruction register of TAP domain 502. The frame counter 740 outputs a TDO output 742 which is input to the multiplexer 110 of the TAP domain 502 and outputs a frame count complete (FCC) signal to I/O controller 704. The frame counter is one of the data registers 108 that can be selected between TDI and TDO, via multiplexer 110, for shifting in data (a frame count) during JTAG DR scan operations. During serial data input and output operations, the frame counter 740 is controlled to count by the I/O controller 704.

During serial input operations, the frame count value shifted into the frame counter determines the number of serial data input frames that will be shifted in from TCK 314 via connection 534. During serial output operations, the frame count value shifted into the frame counter determines the number of serial data output frames that will be shifted out onto TCK 314 via connection 536. The number of serial bits in an input or output frame is determined by the count value in the bit counter 706.

One example circuit 746 for implementing the bit counter 706 is shown to consist of a fixed length down counter 747 which responds to control input from I/O controller 704, during serial input and output operations of the disclosure, to load a fixed bit count value and perform count down operations. When the bit count value reaches zero, the counter 747 outputs the bit count complete (BCC) signal to I/O controller 704. This load and count operation repeats in response to further control input from I/O controller 704.

One example circuit 748 for implementing the frame counter 740 is shown to consist of an N-bit JTAG accessible shift register 750 and a N-bit count down counter 749. A JTAG DR scan operation shifts a desired frame count value into the shift register 750 then updates the frame count value from the shift register to the counter 749. During serial input and output operations of the disclosure, the I/O controller 704 outputs control to cause the counter 749 to count until the frame count reaches zero, which causes the frame counter to output the frame count complete (FCC) signal to the I/O controller 704.

It should be understood that while the bit counter 706 is shown in example 746 as being designed to operate from a fixed bit count value, it could alternately be designed, as is the frame counter 740, to allow a JTAG DR scan operation to load a desired bit count value into the counter via a shift register.

The input to 3-state buffer 710 is coupled to the output of D-FF 708, the control input to the 3-state buffer is coupled to the Out signal from I/O controller 704, and the output of 3-state buffer is coupled to TCK 314 via connection 536. The input to the delay circuit 712 is coupled to the Clock output of I/O controller 704 and the delayed clock (DCK) output of the delay circuit is coupled to the clock input of D-FF 708. As will be discussed later in regard to FIGS. 11A and 11B, the combination of the delay circuit 712 and D-FF 708 provide the circuitry required to achieve the desired timing orchestration between TCK data and TMS clock signals during times when the TAPIO is outputting serial data on TCK.

Shift register 702 includes a plurality of serially connected bit positions 716 located between the shift registers serial input and serial output. In this example, each bit position is comprised of a circuit 714 that contains a multiplexer and a D-FF. As seen, the multiplexer of circuit 714 has inputs for receiving an input from Data Source 522 via bus 718, the Serial Input of circuit 714, and the output of the D-FF of circuit 714. The multiplexer receives Load and Shift control inputs from I/O controller 704 and has an output coupled to the D-FF data input. The D-FF has a clock input coupled to the Clock output of I/O controller 704 and a data output coupled to the Serial Output of circuit 714 and to the Data Destination 524 via bus 716.

The Serial Output of a leading circuit 714 is connected to the Serial Input of a following circuit 714 to form the serially connected bit positions 716 between the serial input and output of shift register 702. As seen and during Clock inputs from I/O controller 704; (1) if Load:Shift=0:0 circuit 714 reloads the present state of the D-FF, (2) if Load:Shift=0:1 circuit 714 shifts data through the D-FF from the Serial Input to the Serial Output, and (3) if Load:Shift=1:0 circuit 714 loads data into the D-FF from Data Source 522.

When the Input Enable (IE) and Output Enable (OE) are both low, the Serial I/O circuit 516 is idle and no serial input or output operations occur. When Input Enable is high and Output Enable is low, the Serial I/O circuit 516 is enabled to input serial data from TCK 314 via connection 534 in response to clock inputs on TMS 316. Prior to performing a serial input operation, the controller 420 will have loaded a frame count in frame counter 740 via a JTAG scan operation. During serial input operations, the I/O controller 704 is clocked by TMS and operates to; (1) output control to load the bit counter 706 with a count indicative of the number of serial bits to receive from the TCK input, (2) output control to the shift register 702 (active Clock and Load:Shift=0:1) to cause shift register to shift in TCK data until the shift register is filled, and (3) to output an Update signal to Data Destination 524 after the shift register fills to indicate that parallel data is available on bus 716.

The I/O controller outputs control to the bit counter to count each time a data bit is shifted into the shift register from TCK. The count in the bit counter determines when the shift register is filled by outputting the bit count complete (BCC) signal to the I/O controller when the bit count expires. When the I/O controller outputs the Update signal in step (3) it also outputs control to the bit counter to load it with the next bit count value. The Update signal also causes the frame counter 740 to count each time a frame of serial data has been shifted into shift register 702 from TCK 314.

The count in the frame counter determines when the selected number of frames has been shifted in by outputting the frame count complete (FCC) signal to the I/O controller when the frame count expires. In this example, the I/O controller pauses the shifting in of TCK data when it outputs the Update signal by setting Load:Shift=0:0. This sequence of serially inputting data into the shift register from TCK 314 until it fills followed by updating the data in parallel to the Data Destination is repeated until the serial input operation has been completed by the FCC signal from the frame counter going high. The FCC frame counter output goes high when the frame count value expires, which indicates that the selected number of serial input frames have been shifted in from TCK 314.

When Input Enable is low and Output Enable is high, the Serial I/O circuit 516 is enabled to output serial data onto TCK 314 via connection 536 in response to clock inputs on TMS 316. Prior to performing a serial output operation, the controller 420 will have loaded a frame count in frame counter 740 and will have disabled its TCK output from driving the TCK signal 314. During serial output operations, the I/O controller 704 is clocked by TMS and operates to; (1) enable the 3-state buffer 710, via the Out control signal, to drive the TCK 314 signal, (2) output control to load the bit counter 706 with a count indicative of the number of serial bits to output on TCK, (3) output control to the shift register 702 (active Clock and Load:Shift=1:0) to cause shift register to load parallel data from Data Source 522, and (4) output control to the shift register (active Clock and Load:Shift=0:1) to cause the shift register to shift out data onto TCK 314 until the shift register is empty.

The Load control signal from the I/O controller in step (3) is also output to the Data Source 522 to indicate to the Data Source that the present parallel data on bus 718 is being loaded into the shift register. The Load signal thus enables the Data Source to know when to fetch and output the next parallel data onto bus 718 for subsequent loading into the shift register. The Load signal also causes the frame counter 740 to count each time a frame of data has been loaded into shift register 702 from Data Source 522. The count in the bit counter determines when the shift register is empty by outputting the bit count complete (BCC) signal to the I/O controller when the count expires. The I/O controller outputs control to the bit counter to count each time a data bit is shifted out of the shift register onto TCK. When the shift register empties, the I/O controller outputs control to cause the bit counter to reload, cause the shift register to load the next parallel data pattern from Data Source 522, and cause the frame counter to count.

This sequence of parallel loading data into shift register 702 from Data Source 522 followed by serially outputting data from the shift register onto TCK 314 until it empties is repeated until the serial output operation has been completed by the FCC output from the frame counter going high. The FCC frame counter output goes high when the frame count value expires, which indicates that the selected number of serial output frames have been loaded and shifted out onto TCK 314. The 3-state buffer 710 remains enabled to drive TCK 314 until the frame counter outputs the FCC signal, which causes the I/O controller 704 to disable the output drive of the 3-state buffer via the Out signal. When the 3-state output buffer is disabled, the controller 420 can enable its TCK output to resume its conventional mode of driving the TCK signal 314.

Figure 8:
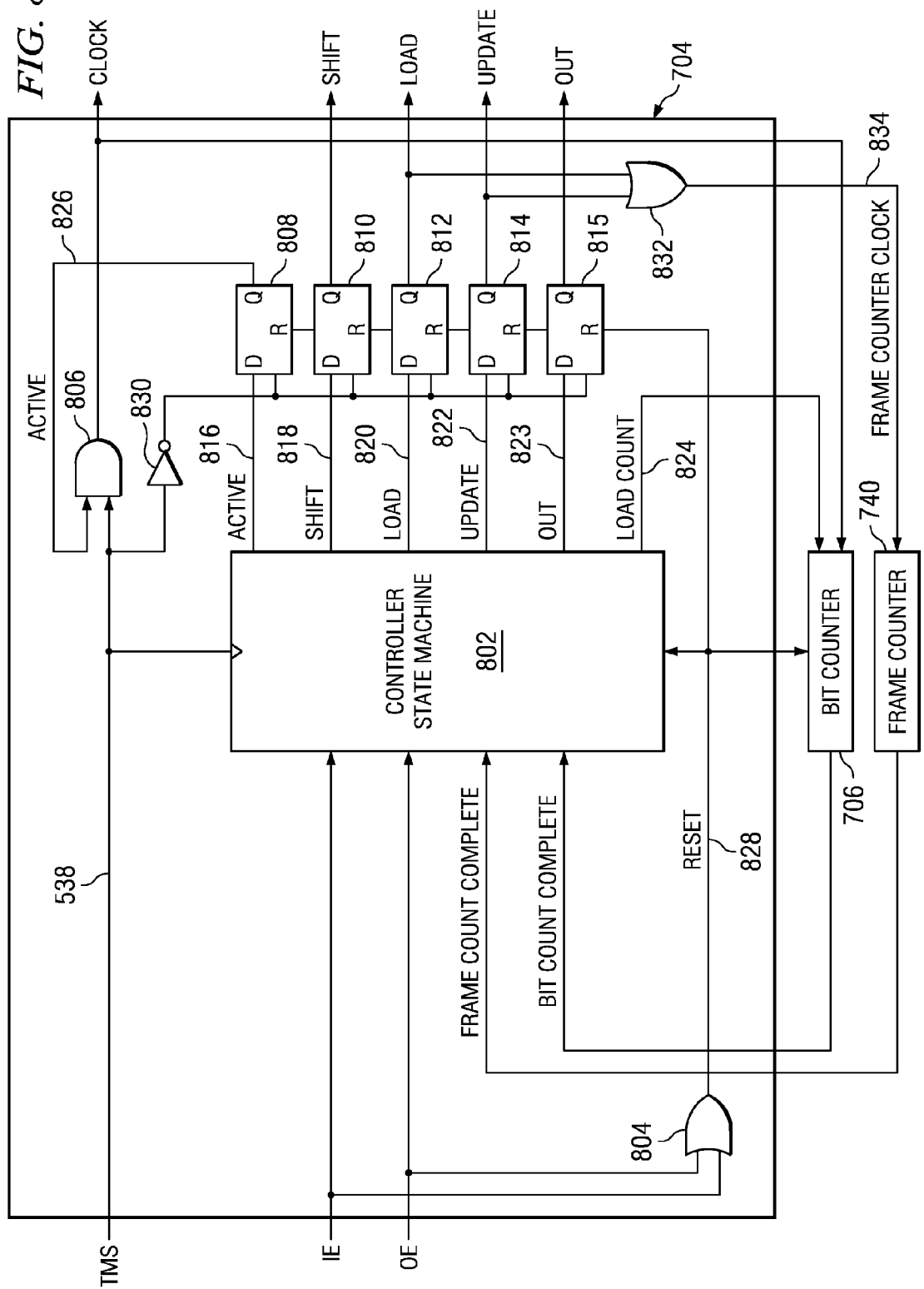
FIG. 8 illustrates the I/O Controller circuit of the present disclosure.

FIG. 8 illustrates an example of the I/O controller circuit 704. The I/O controller circuit consists of a controller state machine 802, OR gates 804 and 832, AND gate 806, inverter 830, and D-FFs 808-815. Controller state machine 802 has a clock input coupled to the I/O controller's TMS clock signal via connection 538, data inputs coupled to the I/O controller's Input Enable (IE), Output Enable (OE), bit count complete (BCC), and frame count complete (FCC) signals, and a reset input coupled to the Reset output 828 from OR gate 804.

Controller state machine 802 operates on the rising edge of the TMS clock input. Controller state machine 802 outputs an active signal 816, a shift signal 818, a load signal 818, an update signal 822, an out signal 823, and a Load Count signal 824.

The D-FF 808 inputs active signal 816 and outputs Active signal 826. D-FF 810 inputs shift signal 818 and outputs the I/O controller's Shift signal. D-FF 812 inputs load signal 820 and outputs the I/O controller's Load signal. D-FF 814 inputs update signal 822 and outputs the I/O controller's Update signal. D-FF 815 inputs out signal 823 and outputs the I/O controller Out signal.

The clock inputs to D-FFs 808-815 are connected to the TMS clock input via inverter 830 to allow the D-FFs to be clocked on the falling edge of the TMS clock input. The reset inputs to D-FF 808-815 are connected to the Reset signal 828 from OR gate 804. OR gate 804 inputs the I/O controller's IE and OE input signals and outputs the Reset signal 828. OR gate 832 inputs the I/O controller's Load and Update output signals and outputs a frame counter clock signal 834. AND gate 806 inputs the TMS clock signal and the Active signal 826, and outputs the I/O controller's Clock signal.

I/O controller 704 outputs the Reset signal 828, the Load Count signal 824, and the I/O controller's Clock signal to bit counter 706. The I/O controller outputs the frame counter clock signal 834 to the frame counter 740. These signals to the bit counter and frame counter form the control input to the counters as shown in FIG. 7.

Figure 9:
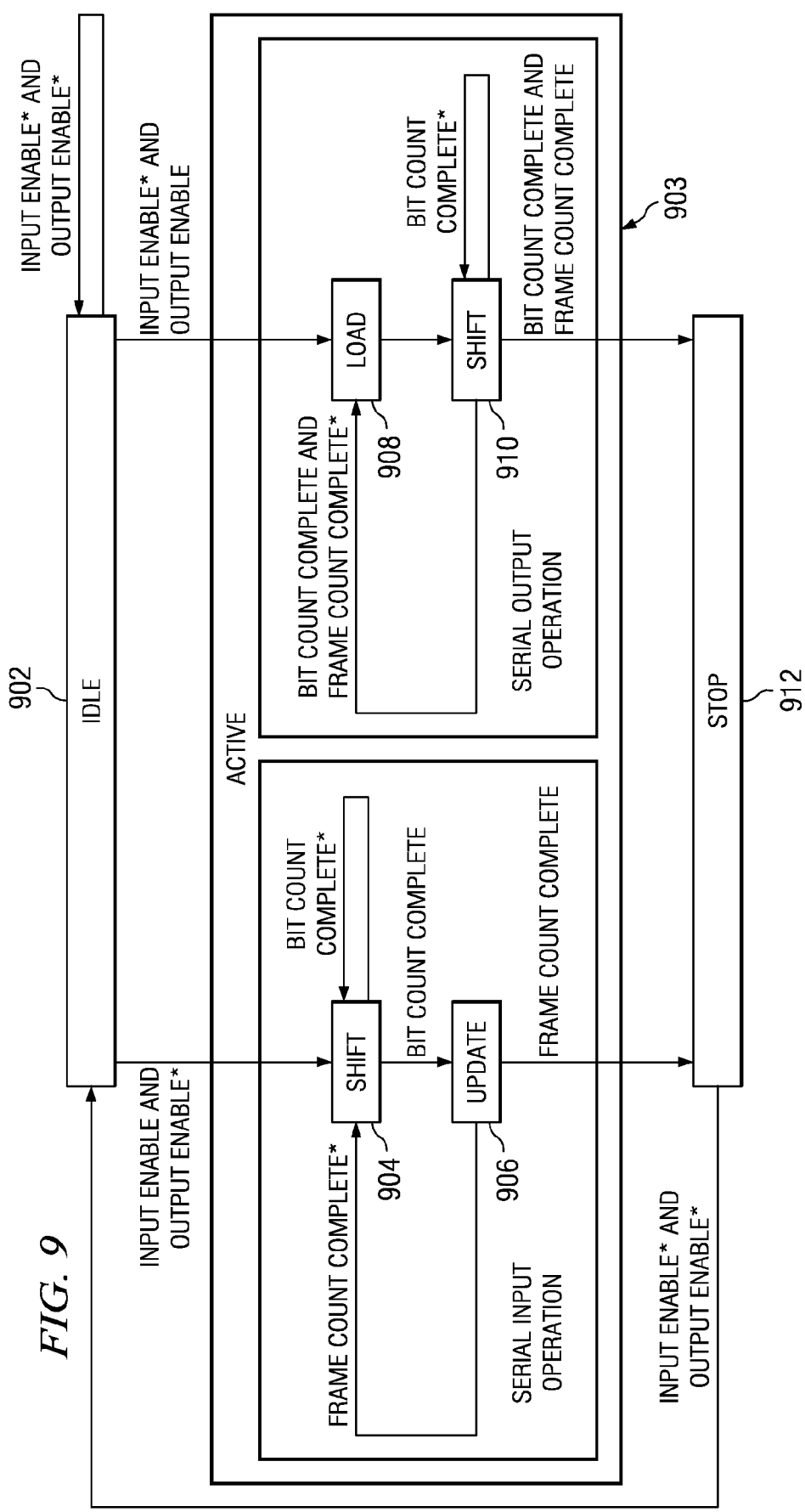
FIG. 9 illustrates the state diagram of the I/O Controller's controller state machine of the present disclosure.

FIG. 9 illustrates the state diagram operation of the example controller state machine 802 of FIG. 8. The following description will reference both FIGS. 8 and 9. In the state diagram IE* indicates a low on IE, OE* indicates a low on OE, BCC* indicates a low on BCC, and FCC* indicates a low on FCC.

When the IE and OE signal are both low, the controller state machine 802 will be in the Idle state 902 by the Reset output 828 from OR gate 804 being low. The IE and OE signals will be set low at power up or reset of the IC/core they reside in. As previously described, the IE and OE signals are set high by a JTAG IR or DR scan operation. In the Idle state, the controller state machine's active 816, shift 818, load 820, update 822, out 823, and Load Count signals will be low. Also in the Idle state, the outputs (Active, Shift, Load, Update, and Out) of D-FFs 808-815 will be low by Reset signal 828 being low. Further during the Idle state, the I/O controller's Clock output will be low since Active signal 826 is low.

Due to Reset 828 being low, which forces the Idle state 902, the controller state machine is not responsive to signaling activity on the TMS signal. Thus while in the Idle state, the I/O controller 704 ignores TMS signaling activity from controller 420 that occurs during conventional JTAG TAP controller operations, such as IR and DR scan operations.

When IE or OE go high, the controller state machine 802 will transition from the Idle state 902 to the Active region 903 of the state diagram on the rising edge of a TMS clock input to perform either a serial input operation (IE high) or a serial output operation (OE high). As seen in this example, the serial input operation consists of Shift 904 and Update 906 states, and the serial output operation consists of Load 908 and Shift 910 states. At the end of a serial input or output operation, the controller state machine 802 will exit the Active region of the state diagram to enter the Stop state 912. When IE and OE are set low, the controller state machine 802 transitions from the Stop state 912 to the Idle state 902.

When a serial input operation is to be performed, a JTAG scan operation will have loaded the frame counter 740 (FCC is low) and set IE high and OE low. IE going high sets Reset 828 high, which removes the reset condition on controller state machine 802, D-FFs 808-815, and bit counter 706. The reset condition to bit counter 706 initializes the bit counter with the appropriate count value, such that when the reset condition is removed the bit counter is preloaded and prepared to count (BCC is low).

With Reset signal 828 high, controller state machine 802 is responsive to TMS clock inputs to sample the state of the IE, OE, BCC, and FCC inputs. As seen in the state diagram, the controller responds to the IE & OE* input condition to transition from the Idle state 902 to the Shift state 904 on the rising edge of an applied TMS clock. The active 816 and shift 818 signals are set high upon entry into the Shift state. The active 816 output remains high while the controller state machine 802 is in the active region 903 of the state diagram. On the falling edge of the TMS clock, D-FFs 808 and 810 output highs on the Active and Shift signals respectively. The high on the Active signal enables AND gate 806 to pass subsequent TMS clocks to the Clock output of the I/O controller 704, which is connected to the shift register 702 and bit counter 706.

With the Shift signal high and Clock signal enabled, the shift register 702 will shift in data from TCK via connection 534 during each subsequent TMS clock input and the bit counter will count the number of shifts. The controller state machine 802 will remain in the Shift state during subsequent TMS clocks until the bit counter outputs a high on the BCC, indicating that a complete frame of data bits have been shifted into the shift register from TCK.

In response to BCC going high, the controller state machine transitions to the Update state 906 on the rising edge of the TMS clock and sets shift 818 signal low, the update 822 signal high, and the Load Count 824 signal high. On the falling edge of the TMS clock, the Shift output from D-FF 810 goes low to pause the shift register from shifting and the Update output of D-FF 814 goes high to indicate to the Data Destination that parallel data from the shift register is available for input. The Update output also causes the frame counter to perform a count operation via the clock output 834 from OR gate 832.

If the FCC signal remains low after the frame counter has been clocked, indicating that at least one more serial input frame is to be performed, the bit counter reloads the bit count value on the next rising edge of the TMS clock (BCC goes low), since Load Count is high. The controller state machine 802 transitions back into the Shift state 904 setting Load Count 824 and update 822 back low and shift 818 back high. On the falling edge of the TMS clock, the Shift output of D-FF 810 goes high, and the Update output of D-FF 814 goes low. The controller state machine 802 will remain in the Shift state 904 with the Shift signal high and Clock signal enabled to shift in the next frame of data from TCK until the BCC input goes high again.

When BCC goes high, the controller state machine 802 will again transition from the Shift state 904 to the Update state 906 where the Shift output will again go low, and the Update and Load Count outputs will again go high. When Update goes high, the frame counter 740 receives another clock input from OR gate 834 to perform another count operation.

If the FCC output of the frame counter goes high in response to the Update clock output from OR gate 832, the frame count has expired and the appropriate number of serial input frames has been received. With FCC high, the controller state machine will transition on the next rising edge of the TMS clock from the Update state 906 to the Stop state 912 to exit the active region 903 of the state diagram and end the serial input operation. Upon entry into the Stop state 908, the active 816, shift 818, load 820, update 822, out 823, and Load Count outputs of controller state machine 802 go low. On the falling edge of the TMS clock in the Stop state 908, the Clock, Shift, Load, Update and Out signals of the I/O controller go to and remain low. A JTAG IR or DR scan operation can be executed to set IE and OE low to force the controller state machine from the Stop state 912 to the Idle state 902.

The above described process of shifting data frames from TCK into the shift register and updating the data frames in parallel to the Data Destination 524 repeats until the desired number of data frames have been serially input and updated to the Data Destination, as indicated by FCC going high. The above process is executed while the TAP controller 104 is in a steady state as described previously in regard FIGS. 6A and 6B.

When a serial output operation is to be performed, JTAG scan operations will have loaded the frame counter 740 (FCC is low) and set IE low and OE high. OE going high sets Reset signal 828 high, which removes the reset condition on controller state machine 802, D-FFs 808-815, and bit counter 706 (BCC is low). With Reset signal 828 high, controller state machine is responsive to TMS clock inputs to sample the state of the IE, OE, BCC, and FCC inputs.

In the state diagram, the controller 802 responds to the IE* & OE input condition to transition from the Idle state 902 to the Load state 908 on the rising edge of an applied TMS clock. The active 816, load 820, out 823, and Load Count 824 signals are set high upon entry into the Load state. The active 816 and out 823 signal outputs will remain high while the controller state machine 802 is in the active region 903 of the state diagram. On the falling edge of the TMS clock, D-FFs 808, 812, and 815 output highs on the Active, Load, and Out signals respectively.

The high on the Out signal enables the 3-state buffer 710 to drive the TCK signal 314 via connection 536. 3-State buffer 710 is unopposed in driving the TCK signal 314 since controller 420 will have disabled its drive of the TCK signal 314 prior to the start of the serial output operation. The high on the Active signal enables AND gate 806 to pass subsequent TMS clocks to the Clock output of the I/O controller 704, which is connected to the shift register 702 and bit counter 706. The high transition on the Load signal causes the frame counter 740 to perform a count operation via the clock output 834 of OR gate 832.

With the Load signal high and Clock signal enabled, the next rising edge of the TMS clock will load a parallel data frame from Data Source 522 into shift register 702 and will load the bit count value into the bit counter (BCC is low) since the Load Count signal is high. The Load signal output to Data Source 22 indicates to the Data Source that the present parallel data frame has been loaded so that the Data Source can fetch the next parallel data frame to be loaded.

In response to the rising edge of the TMS clock that loads data from the Data Source, the controller transitions from the Load state 908 to the Shift state 910. Upon entry into the Shift state, the load signal 820 and Load Count signal 824 go low and the shift signal 818 goes high. On the falling edge of the TMS clock, the Load output of D-FF 812 goes low and the Shift output of D-FFs 810 goes high. With the Shift signal high and Clock signal enabled, the shift register 702 will shift out data onto TCK via connection 536 during each subsequent TMS clock input and the bit counter will count the number of shifts. The controller state machine 802 will remain in the Shift state during subsequent TMS clocks until the bit counter outputs a high on the BCC signal, indicating that a complete frame of data bits have been shifted out of the shift register onto TCK.

If the FCC signal is low, indicating that the frame count in the frame counter has not expired, the controller state machine responds to the BCC signal to transition back into the Load state 908 on the rising edge of the TMS clock to set shift 818 signal low, the load 820 signal high, and the Load Count 824 signal high. On the falling edge of the TMS clock, the Shift output from D-FF 810 goes low and the Load output from D-FF 812 goes high. The high transition on the Load output signal causes the frame counter 740 to perform another count operation, via the clock output 834 of OR gate 832.

On the next rising edge of the TMS clock the shift register loads the next parallel data frame output from Data Source 522, the bit counter is reloads with the bit count (BCC is low) since Load Count is high, and the controller state machine 802 transitions back into the Shift state 910. The load signal 820 and Load Count signal 824 go low and the shift signal 818 goes high upon re-entry into the Shift state. On the falling edge of the TMS clock, the Load output of D-FF 812 goes low and the Shift output of D-FFs 810 goes high. With the Shift signal high and Clock signal enabled, the shift register 702 will shift out the data frame onto TCK via connection 536 during each subsequent TMS clock input and the bit counter will count the number of shifts.

The controller state machine 802 remains in the Shift state during subsequent TMS clocks until the bit counter again outputs the BCC signal, indicating again that a complete frame of data bits have been shifted out of the shift register onto TCK.

If FCC is high, indicating that the frame count in the frame counter expired on the last Load signal clock input from OR gate 832, the controller state machine will respond to the high on the BCC signal to transition from the Shift state 910 to the Stop state 912 on the rising edge of the TMS clock to exit the active region 903 of the state diagram and end the serial output operation. Upon entry into the Stop state, the active 816, shift 818, load 820, update 822, out 823, and Load Count outputs of controller state machine 802 go low. On the falling edge of the TMS clock in the Stop state, the Clock, Shift, Load, Update and Out signals of the I/O controller go to and remain low. A JTAG IR or DR scan operation can be executed to set IE and OE low to force the controller state machine from the Stop state 912 to the Idle state 902.

As seen from the description above, the serial output operation will continue to load and shift out data frames onto TCK until the controller state machine recognizes the input condition where both BCC and FCC are high (i.e. BCC & FCC). This condition occurs when the frame count has expired and the last bit of the last frame has been shifted out onto TCK 314. When this condition is recognized, the controller state machine will transition from the Shift state 910 to the Stop state 912 and disable further load and shift out operations. The above process is executed while the TAP controller is in a steady state as described previously in regard FIGS. 6A and 6B.

It is important to note that the I/O controller's Out signal will go low in the Stop state 912 to disable the output drive of the 3-state buffer 710. This is an important feature in that it allows the controller 420 to enable its TCK output to regain drive control of the TCK signal line. The frame counter's ability to count the number of frames and to indicate to the controller state machine 802, via the FCC signal, when the last frame is being sent allows the controller state machine to transition to the Stop state after the last bit of the last frame has been sent to disable the drive of the 3-state buffer 710.

Without this indication from the frame counter and the response to the indication by the controller state machine, the 3-state buffer 710 could not be disabled, which would not allow the controller 420 to enable its TCK output and regain drive control of the TCK signal line. When the controller 420 regains drive control of the TCK signal line, it can perform the above mentioned JTAG IR or DR scan operation to set IE and OE low to force the controller state machine from the Stop state 912 to the Idle state 902.

Figure 1:
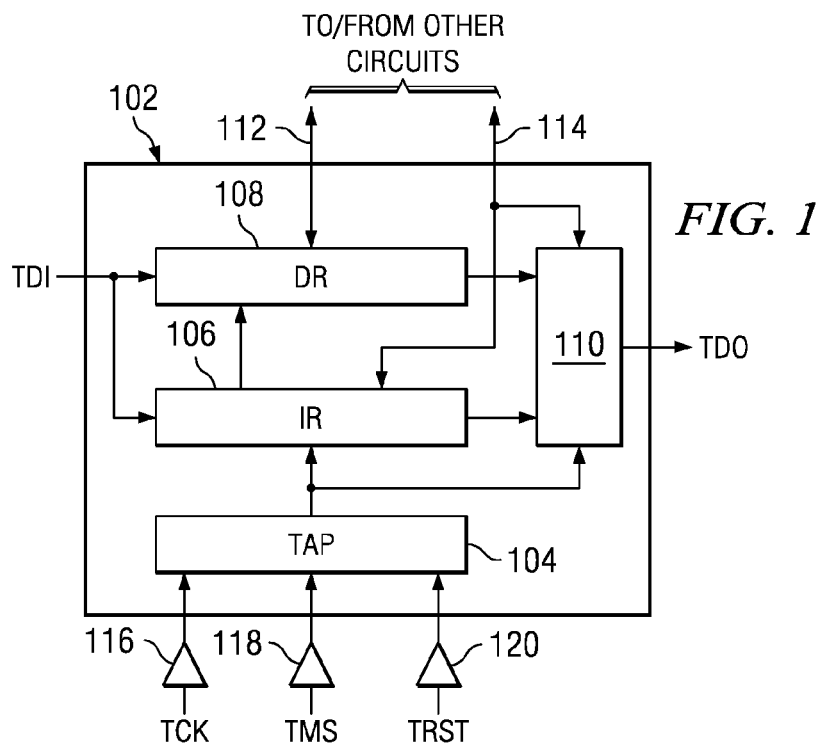
FIG. 1 illustrates a conventional IEEE 1149.1 TAP domain architecture.
Figure 10A:
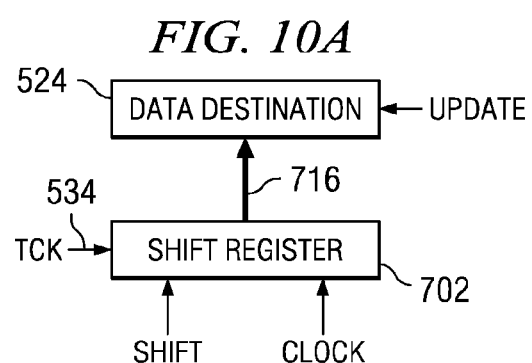
FIG. 10A illustrates the serial input and parallel output circuitry of the Serial I/O Circuitry of FIG. 7.
Figure 10B:
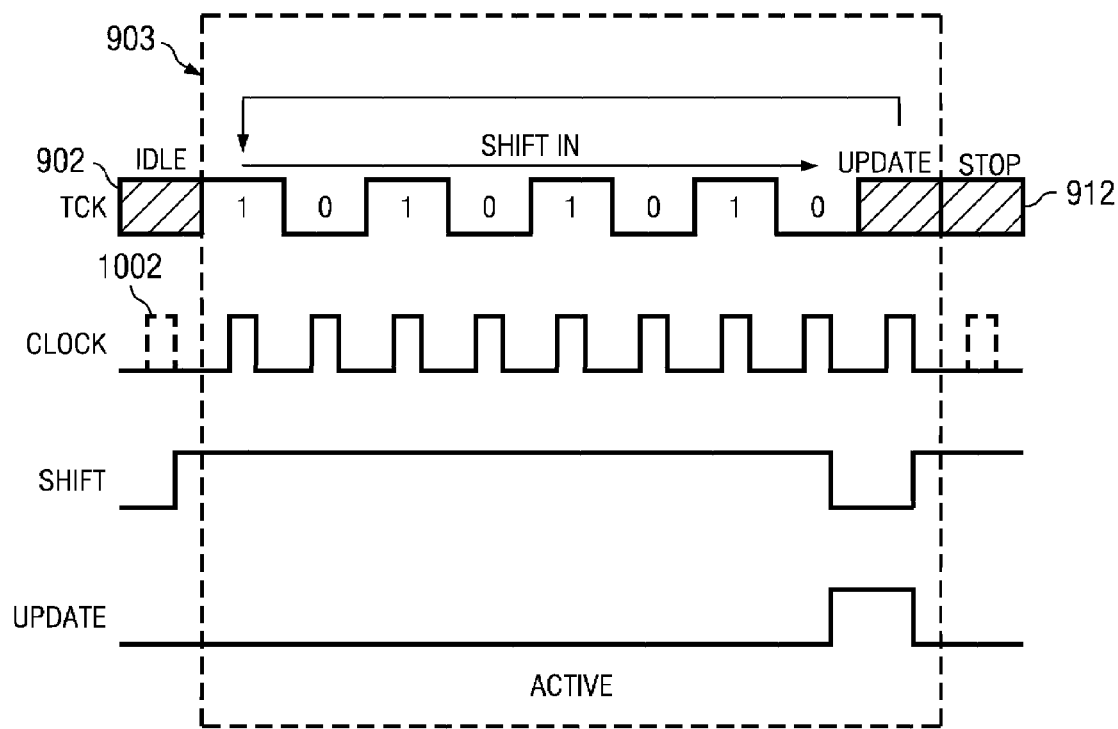
FIG. 10B illustrates the timing of the serial input and parallel output circuitry of FIG. 10A.

FIG. 10A illustrates the serial input operation whereby the shift register 702 shifts in data from TCK and updates the data to Data Destination 524. FIG. 10B illustrates the timing of the serial input operation. As seen in FIG. 10B, the serial input operation will begin by the controller state machine 802 transitioning from the Idle state 902 to the Shift state 904 in the Active region 903 of the state diagram. The dotted line clock 1002 on the Clock signal of the timing diagram indicates the TMS clock input that causes the transition from the Idle state to the Shift state.

In the Shift state, the I/O controller 704 will output a high on its Shift output and clocks (continuous line clocks) on its Clock output to cause the shift register 702 to input a data frame (alternating 1's and 0's in this example) from TCK. When the shift register fills with data (BCC is high) the I/O controller 704 will transition to the Update state 906 to set the Shift output low and the Update output high. Data Destination 524 responds to the high on the Update output to load the parallel data frame from shift register 702 via bus 716. From the Update state, the I/O controller may transition back to the Shift state 904 (FCC is low) to input another frame of data or transition to the Stop state 912 (FCC is high) to end the serial input operation. This shift in and update process repeats until the overall serial input operation has been completed with the controller state machine in the Stop state.

It is important to notice in the timing diagram of FIG. 10B that the TMS driven clock pulses on the Clock output of I/O controller 704 appear only during times when the TCK data input is in a stable logic one or zero state and that the TMS driven Clock output of I/O controller 704 is always low when a data transition occurs on the TCK data input, especially the rising edge TCK data transitions. As mentioned previously in regard to FIGS. 6B and 6C, the controller 420 orchestrates this TCK and TMS timing during serial input operations to a TAPIO 416 to prevent the TAP controllers 104 of TAPIOs 416 from seeing a logic high on TMS during a rising edge on TCK. If this were to occur the TAP controllers 104 would transition from the Run Test/Idle state and disrupt the serial input operation.

Figure 11A:
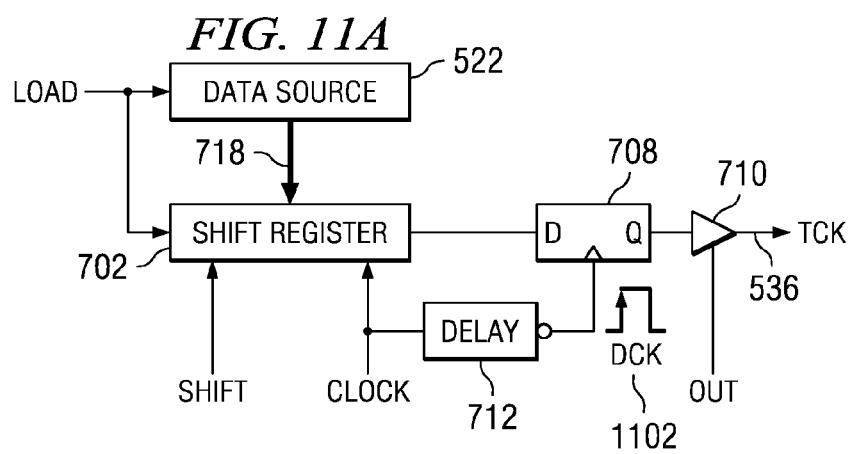
FIG. 11A illustrates the parallel input and serial output circuitry of the Serial I/O Circuitry of FIG. 7.
Figure 11B:
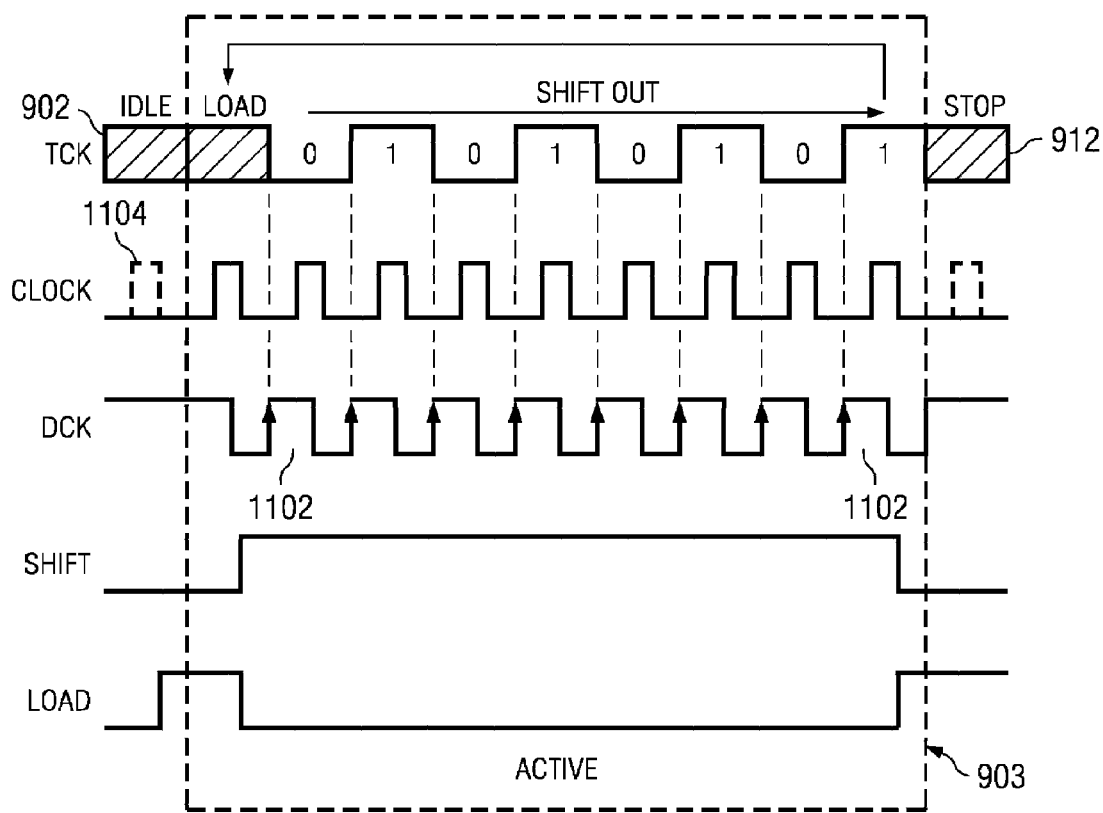
FIG. 11B illustrates the timing of the parallel input and serial output circuitry of FIG. 11A.

FIG. 11A illustrates the serial output operation whereby the shift register 702 loads data from Data Source 522 and shifts out the data on TCK. FIG. 11B illustrates the timing of the serial output operation. As seen in FIG. 11B, the serial output operation will begin by the controller state machine 802 transitioning from the Idle state 902 to the Load state 908 of the Active region 903 of the state diagram. The dotted line clock 1104 on the Clock signal of the timing diagram indicates the TMS clock input that causes the transition from the Idle state to the Load state 908.

In the Load state 908, the I/O controller's Out output is set to enable the 3-state buffer 710 to drive the TCK signal via connection 536. In the Load state 908, the I/O controller 704 will output a high on its Load output and a clock (continuous line clock) on its Clock output to cause the shift register 702 to load a data frame (alternating 1's and 0's in this example) from Data Source 522 via bus 718. As previously mentioned, Data Source 522 initiates the fetching of the next data frame to load in response seeing the Load output high.

Following the load, the I/O controller 704 transitions to the Shift state 910 to set its Load output low and its Shift output high to shift out the data frame on TCK during Clock outputs (continuous line clocks). In the Shift state, the I/O controller's Out output remains set to enable the 3-state buffer 710 to drive the TCK signal via connection 536. When the shift register has shifted out the first frame of data and if a second frame is to be loaded and sent (BCC & FCC* condition), the I/O controller 704 transitions from the Shift state to the Load state to set its Shift output low and its Load output high to load the next parallel data frame from Data Source 522.

After all data frames have been loaded and shifted out (BCC & FCC condition), the I/O controller 704 will transition from the Shift state 910 to the Stop state 912 to terminate the serial output operation and disable the 3-state output buffer 710 by setting the Out signal low. As seen in the timing diagram, in the Stop state the Clock output is gated low by And gate 806 to prevent further TMS clocks 1106, if any, from being output on the Clock output.

It is important to notice in the timing diagram of FIG. 11B that the TMS clock pulses driving the Clock output of I/O controller 704 appear only during times when the TCK data output is in a stable logic one or zero state and that the TMS clock pulses are always low when a data transition occurs on the TCK data output, especially the rising edge TCK data output transitions.

As mentioned previously in regard to FIG. 7, the Delay Circuit 712 and D-FF 708 of the Serial I/O circuit 516 provide the circuitry to orchestrate the timing of the TCK data output from 3-state buffer 710 such that data transitions, especially rising edge data transitions, on the TCK output only occur when the TMS clock pulses are in a low logic state, as seen in the TCK and TMS driven Clock signal timing of FIG. 11B. This TCK and TMS driven Clock signal timing during serial output operations from TAPIO 416 prevents the TAP controllers 104 of TAPIOs 416 from seeing a logic high on TMS when a rising edge occurs on TCK, which would cause the TAP controllers to transition from the Run Test/Idle state and disrupt the serial output operation.

As shown in FIG. 7, the Delay circuit 712 can be simply a string of inverters which input the TMS driven Clock signal from I/O Controller 704 and output a delayed and inverted DCK signal 1102. The DCK signal 1102 is input to the clock input of D-FF 708. On each rising edge of the DCK signal, D-FF 708 inputs the serial data output of shift register 702 and outputs the data on TCK via 3-state buffer 710. By using Delay circuit 712 in combination with D-FF 708 the TCK data transitions in the timing diagram of FIG. 11B occur such that during TCK data transitions the TMS driven Clock signal output from I/O Controller 704 is in a low logic state. While Delay circuit 712 and D-FF 708 provide one example of how to delay the TCK output signal such that TCK data output transitions occur while the TMS driven Clock signal is in a low logic state, other circuit examples could be devised to achieve the same goal.

FIGS. 12A through 12D illustrate a system example consisting of two ICs 1202 and 1204, each with a TAPIO 416 that is coupled to controller 420 via TMS and TCK signal paths. The TCK terminal of each IC is connected to input buffer 116 of FIG. 5 and 3-state output buffer 710 of FIG. 7. The 3-state output buffer 710 is shown external to the TAPIO for clarity. The TMS terminal of each IC is coupled to input buffer 118 of FIG. 5. The enable input of each 3-state output buffer 710 is controlled by the Out signal 1203 of the I/O controller of TAPIOs 416.

The TMS terminal of the controller 420 is connected to an output buffer 1214 and the TCK terminal of the controller 420 is connected to an input buffer 1212 and an output buffer 1208. Control circuitry 1206 in controller 420 is coupled to buffers 1208, 1212, and 1214 to allow the controller 420 to input or output on TCK and to output on TMS. As seen, the control circuitry has an enable output 1210 to output buffer 1208 to allow the TCK terminal of the controller 420 to operate as either an input or an output. The control circuitry 1206 is designed to operate the TCK and TMS terminals according to either the IEEE 1149.1 standard (JTAG) timing whereby TMS and TCK both operate as outputs, or the timing of the present disclosure whereby TMS operates as an output while TCK may operate as either an output or an input.

Figure 12A:
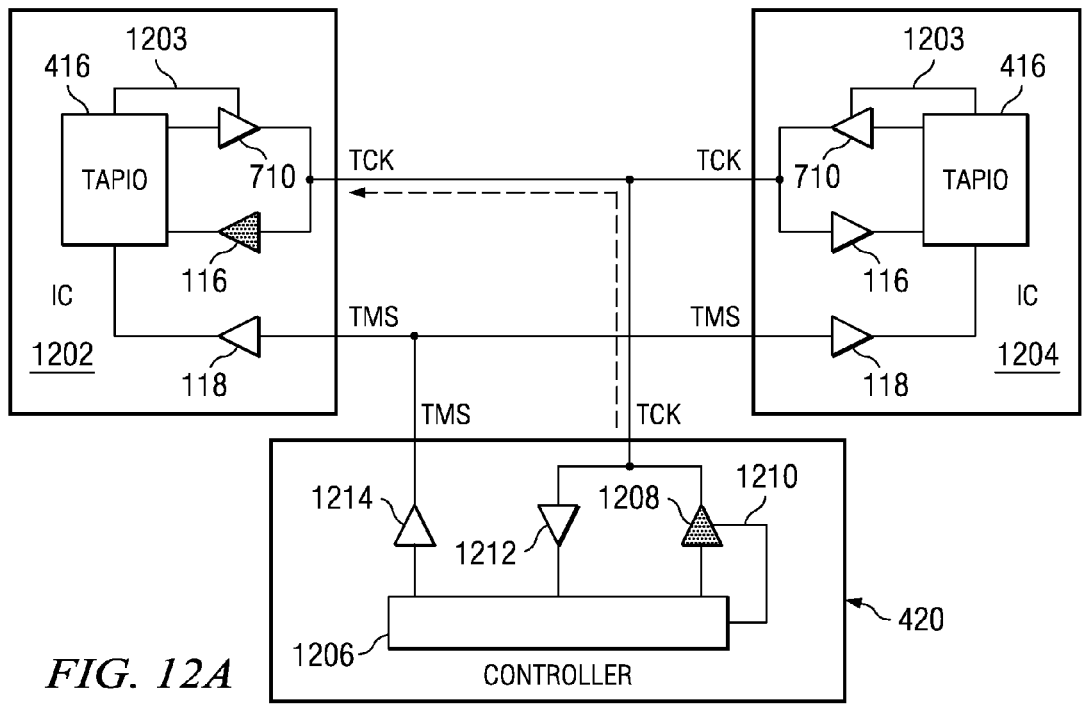
FIG. 12A illustrates a controller communicating to an IC according to the present disclosure.

In FIG. 12A, the TAPIO 416 of IC 1202 has been set by a JTAG scan from controller 420 to perform a serial input operation (IE high and OE low) from controller 420 according to the present disclosure, and the TAPIO 416 of IC 1204 has been set by the JTAG scan not to perform any operation (IE and OE both low). During the serial input operation, the controller puts the TAP controllers 104 of the TAPIOs 416 in the Run Test/Idle state and outputs TMS clocks and TCK data to the TAPIO of IC 1202. The flow of data from the TCK terminal of controller 420 to the TAPIO 416 of IC 1202 is shown in dotted line and passing through darkened buffers. As seen the 3-state buffer 710 of ICs 1202 and 1204 are disabled via Out signal 1203 during the serial input operation to allow the controller 420 to input data to the TAPIO of IC 1202 via the TCK path. This method of serial communication allows data from the controller 420 to be quickly transferred to an IC's TAPIOs.

Figure 12B:
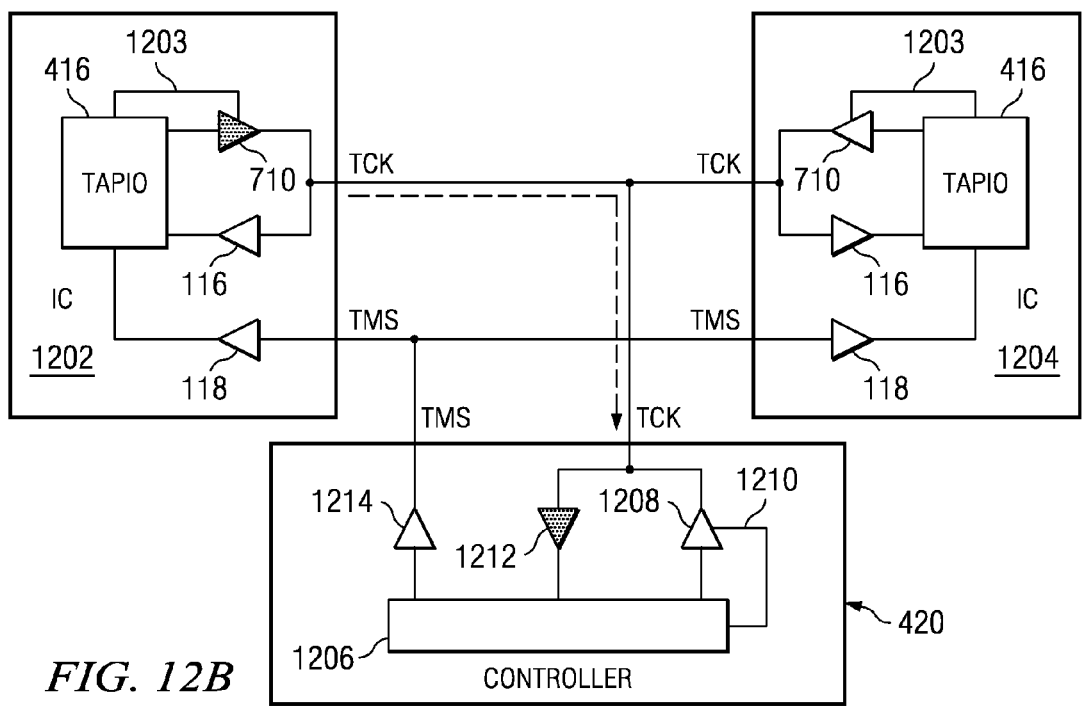
FIG. 12B illustrates an IC communicating to a controller according to the present disclosure.

In FIG. 12B, the TAPIO of IC 1202 has been set by a JTAG scan from controller 420 to perform a serial output operation (IE low and OE high) to controller 420 according to the present disclosure, and the TAPIO of IC 1204 has been set by the JTAG scan to not perform any operation (IE and OE both low). To start the serial output operation, the controller puts the TAP controllers 104 of the TAPIOs 416 in the Run Test/Idle state, disables its TCK output buffer 1208, and outputs TMS clocks to the TAPIO of IC 1202.

The TAPIO of IC 1202 responds by enabling 3-state buffer 710 via Out signal 1203 and outputting data from its TCK terminal to the TCK terminal of controller 420. The data flow is shown by the dotted line and passing through darkened buffers. The 3-state buffer 710 of IC 1204 is disabled during the serial output operation from IC 1202. At the end of the serial output operation, the TAPIO of IC 1202 disables the 3-state output buffer 710 to allow the controller to regain drive control of the TCK signal path. This method of serial communication allows data from an IC's TAPIO to be quickly transferred to a controller 420.

Figure 12C:
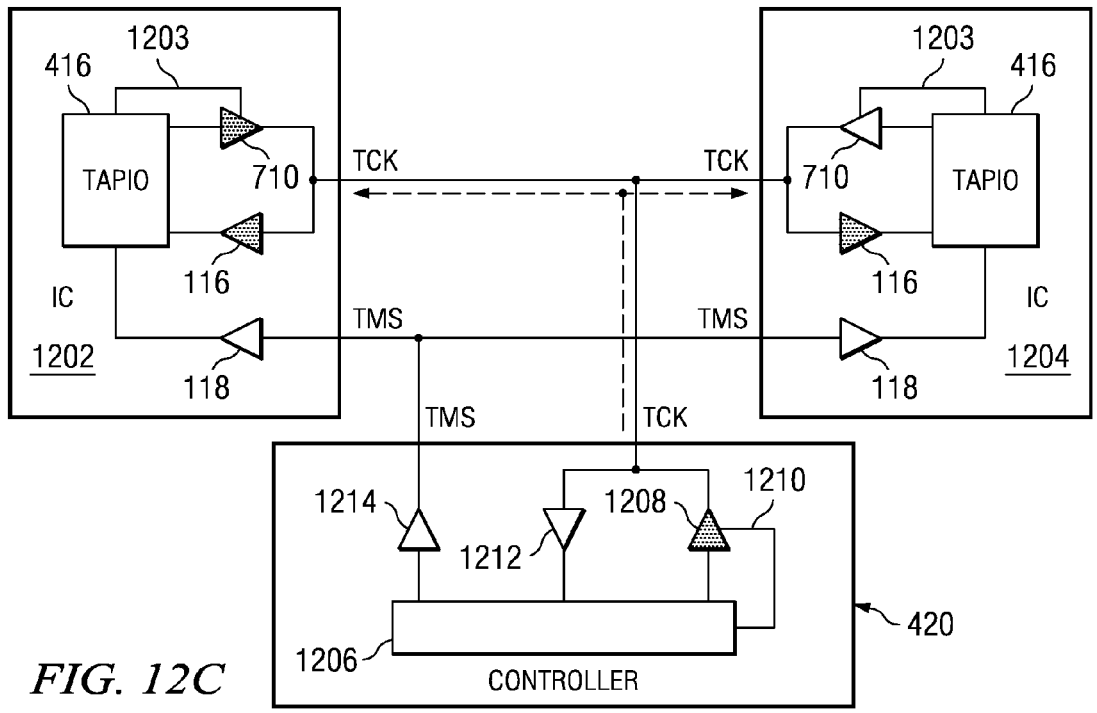
FIG. 12C illustrates a controller communicating to two ICs according to the present disclosure.

In FIG. 12C, the TAPIOs 416 of ICs 1202 and 1204 have both been set by a JTAG scan from controller 420 to perform a serial input operation (IE high and OE low) from controller 420 according to the present disclosure. During the serial input operation, the controller puts the TAP controllers 104 of the TAPIOs 416 in the Run Test/Idle state and outputs TMS clocks and TCK data to the TAPIOs of ICs 1202 and 1204. The flow of data from the TCK terminal of controller 420 to the TAPIOs of ICs 1202 and 1204 is shown in dotted line and passing through darkened buffers.

As seen, the 3-state buffer 710 of ICs 1202 and 1204 are disabled via Out signals 1203 during the serial input operation to allow the controller to input data to the TAPIOs of both ICs via the TCK path. FIG. 12C illustrates that a controller 420 can perform a serial input operation to a plurality of IC resident TAPIOs simultaneously. Each TAPIO will receive the same serial data input frames from the controller 420. This method of serial communication allows data from a controller 420 to be quickly transferred to a plurality of IC TAPIOs at the same time. For example, this method of serial communication could be used quickly to upload common data frames to multiple TAPIOs to enable parallel test, trace, emulation, in-system-programming, or functional operations in multiple ICs.

Use of the parallel serial input method of FIG. 12C requires the input frames to have the same number of bits, which implies the serial bit length of the shift register 702 of the TAPIOS 416 will be the same length. The frame counters 740 of each TAPIO 416 may be loaded with the same or different frame count. If loaded with the same frame count, both TAPIOs will input the same number of frames then stop. However it is possible to load one TAPIO with a first frame count and the other TAPIO with a second frame count that is larger than the first frame count.

In this case, both TAPIOs 416 would input frames until the first frame count expires, which would causes the TAPIO with the first frame count to stop inputting frames. The TAPIO with the second frame count would continue to input frames until its frame count expires then it would stop. Thus by loading different frame counts into different TAPIOs, it is possible to continue to input frames to TAPIOs with larger frame counts after TAPIOs with smaller frame counts have stopped their serial input operations by going to the Stop state 912.

Figure 12D:
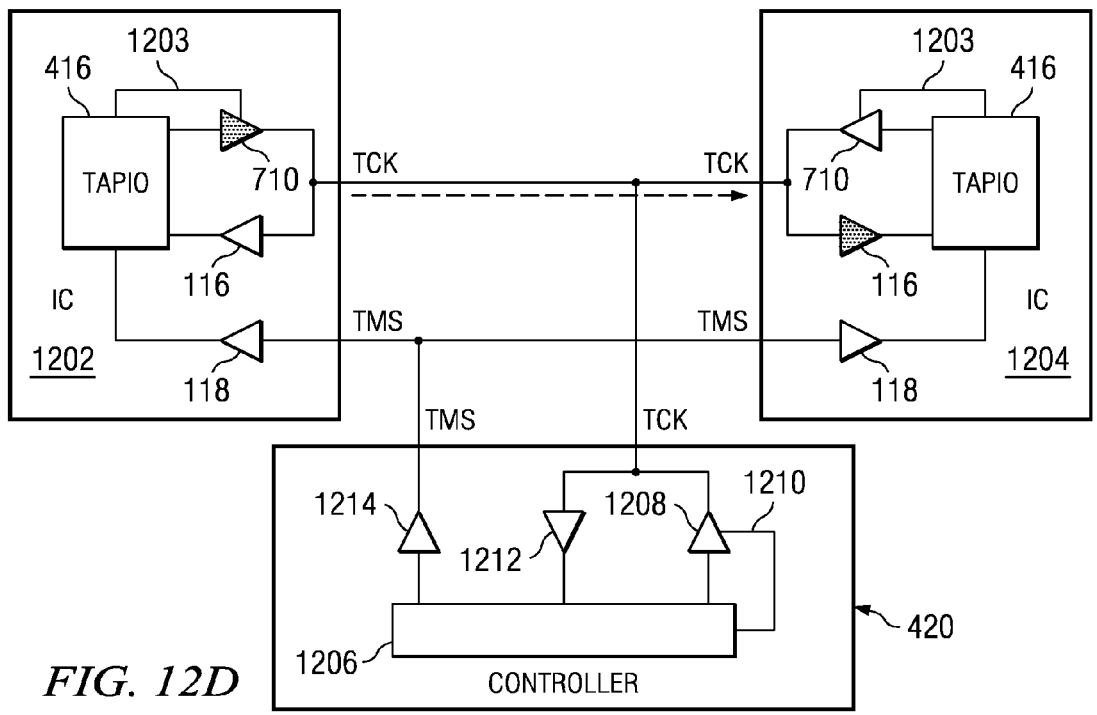
FIG. 12D illustrates one IC communicating to another IC according to the present disclosure.

In FIG. 12D, the TAPIO 416 of IC 1202 has been set by a JTAG scan from controller 420 to perform a serial output operation (IE low and OE high) and the TAPIO 416 of IC 1204 has been set by the JTAG scan operation to perform a serial input operation (IE high and OE low) according to the present disclosure. With this setting the TAPIO of IC 1202 becomes a transmitter for outputting data on TCK and the TAPIO of IC 1204 becomes a receiver for inputting data from TCK.

During the serial operations, the controller 420 puts the TAP controllers 104 of the TAPIOs 416 in the Run Test/Idle state, disables its TCK output buffer 1208, and outputs TMS clocks to the TAPIOs 416 of ICs 1202 and 1204. The flow of data from the TCK terminal of IC 1202 to the TCK terminal of IC 1204 is shown in dotted line and passing through darkened buffers. When the IC to IC data communication has been completed, the TAPIO of IC 1202 disables its 3-state buffer 710 to allow the controller 420 to regain control of the TCK signal path. Similar IC to IC communication can occur from IC 1204 to IC 1202 by simply reversing the transmitter and receiver roles of the TAPIOs. This method of serial communication allows data from one IC's TAPIO to be quickly transferred to another IC's TAPIO.

Figure 13:
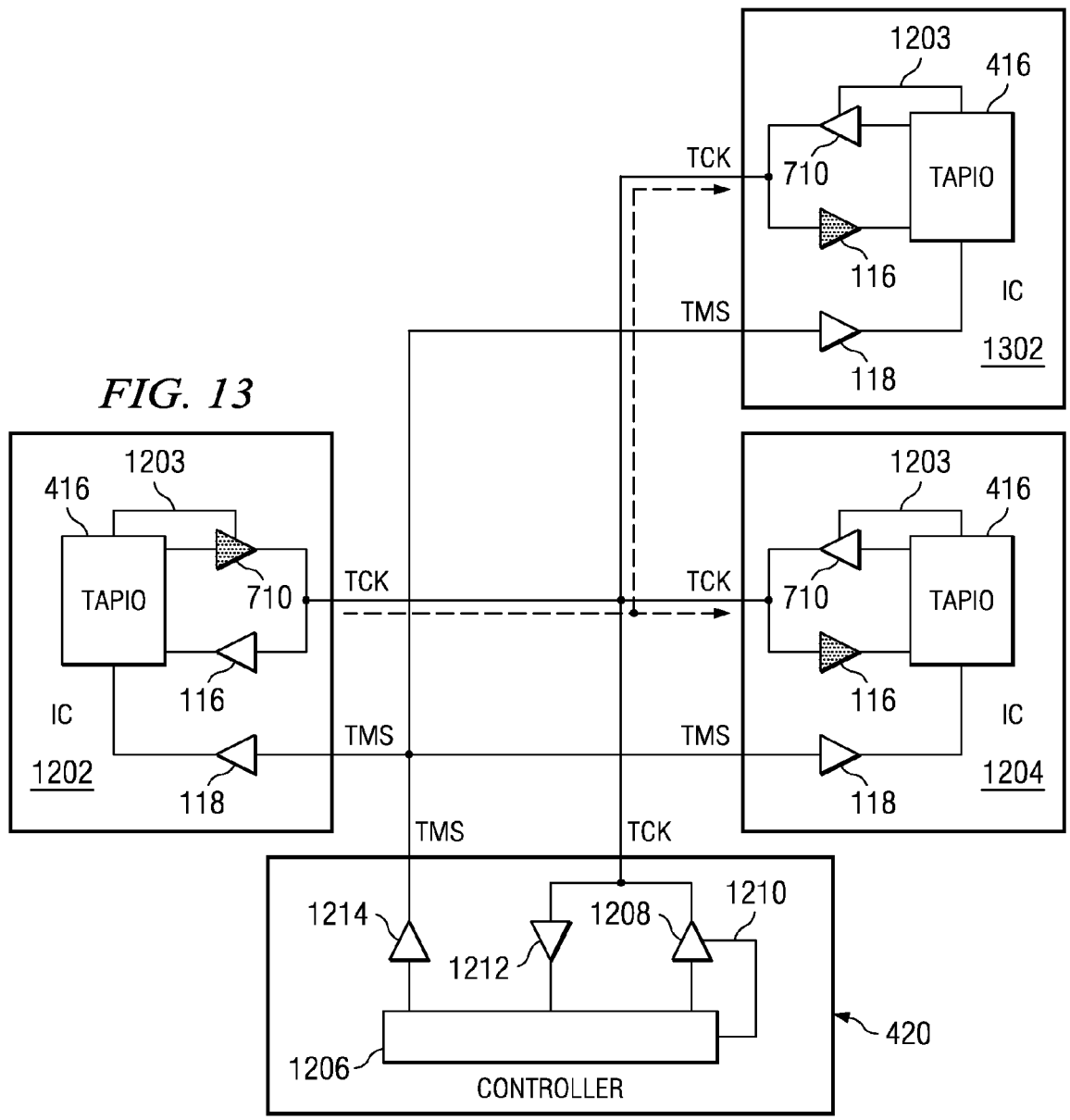
FIG. 13 illustrates one IC communicating to two ICs according to the present disclosure.

FIG. 13 illustrates a system with a controller 420 coupled to TAPIOs of ICs 1202, 1204, and 1302 via TCK and TMS. In FIG. 13, the TAPIO 416 of IC 1202 has been set by a JTAG scan from controller 420 to perform a serial output operation (IE low and OE high) and the TAPIOs 416 of ICs 1204 and 1302 have been set by the JTAG scan operation to perform a serial input operation (IE high and OE low) according to the present disclosure. With this setting the TAPIO of IC 1202 becomes a transmitter for outputting data on TCK and the TAPIOs of ICs 1204 and 1302 become receivers for inputting data from TCK. During the serial operations, the controller puts the TAP controllers 104 of the TAPIOs in the Run Test/Idle state, disables its TCK output buffer 1208, and outputs TMS clocks to the TAPIOs of ICs 1202, 1204, and 1302. The flow of data from the TCK terminal of IC 1202 to the TCK terminal of ICs 1204 and 1302 is shown in dotted line and passing through darkened buffers.

When the single IC to multiple IC data communication has been completed, the TAPIO of IC 1202 disables its 3-state buffer 710 to allow the controller 420 to regain control of the TCK signal path. FIG. 13 simply illustrates that a TAPIO 416 of one IC can communicate data to a plurality of TAPIOs 416 in other ICs. As with the plural data communication described in regard to FIG. 12C, the frame counters of the receiving TAPIOs of ICs 1204 and 1302 can be set to the same or different frame counts. The frame counter of the transmitting TAPIO of IC 1202 will be set to a frame count equal to the largest frame count loaded into the receiving TAPIOs. This method of serial communication allows data from one IC's TAPIO to be quickly transferred to a plurality of other IC TAPIOs.

FIGS. 14A through 14D illustrate a system with a controller 420 coupled to TAPIOs 416 of embedded core subcircuits 1404 and 1406 within an IC 1402 via TCK and TMS. When multiple TAPIOs in a single IC are coupled to the controller 420, the output of the IC's TCK 314 input buffer 116 is coupled to all the TAPIO TCK inputs via connection 534 and the TCK output of each TAPIOs 3-state buffer 710 is coupled to the TCK terminal 314 of the IC via connections 536. In this arrangement the ICs TCK terminal 314 can input to all TAPIO TCK inputs via input buffer 116 and connection 534 and each TAPIO TCK output can be enabled to drive the IC's TCK terminal 314 via the TAPIO's 3-state buffer 710 and connection 536.

Figure 14A:
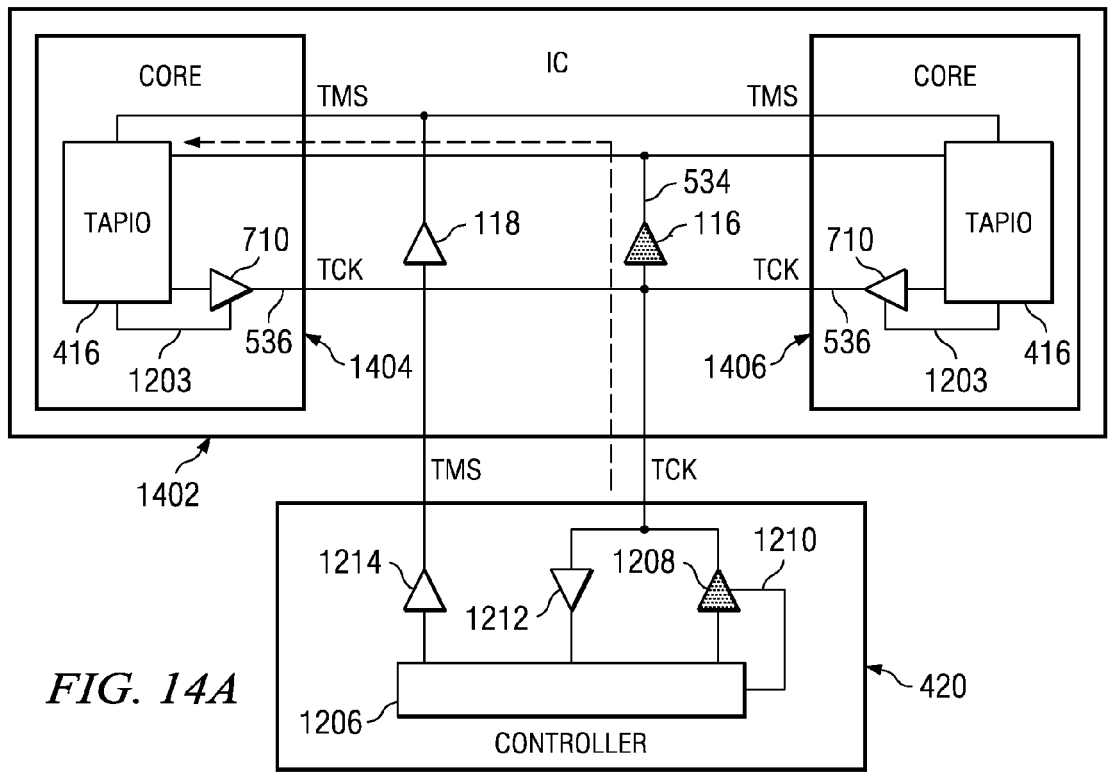
FIG. 14A illustrates a controller communicating to an embedded core circuit in an IC according to the present disclosure.

In FIG. 14A, the TAPIO 416 of core 1404 has been set by a JTAG scan from controller 420 to perform a serial input operation (IE high and OE low) from controller 420 according to the present disclosure, and the TAPIO 416 of core 1406 has been set by the JTAG scan not to perform any operation (IE and OE both low). During the serial input operation, the controller puts the TAP controllers 104 of the TAPIOs 416 in the Run Test/Idle state and outputs TMS clocks and TCK data to the TAPIO of core 1404. The flow of data from the TCK terminal of controller 420 to the TAPIO 416 of core 1404 is shown in dotted line and passing through darkened buffers. As seen the 3-state buffer 710 of cores 1404 and 1406 are disabled via Out signal 1203 during the serial input operation to allow the controller 420 to input data to the TAPIO of core 1404 via the TCK path. This method of serial communication allows data from the controller 420 to be quickly transferred to an embedded core's TAPIOs.

Figure 14B:
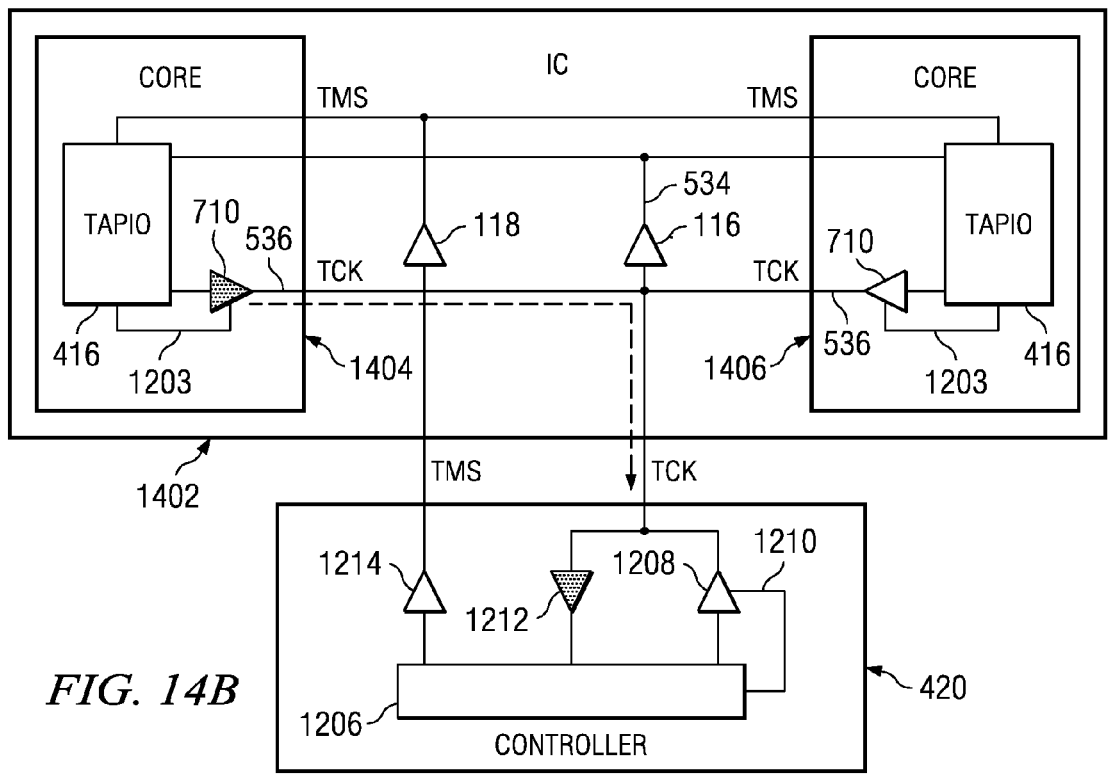
FIG. 14B illustrates an embedded core circuit in an IC communicating to a controller according to the present disclosure.

In FIG. 14B, the TAPIO of core 1404 has been set by a JTAG scan from controller 420 to perform a serial output operation (IE low and OE high) to controller 420 according to the present disclosure, and the TAPIO of core 1406 has been set by the JTAG scan to not perform any operation (IE and OE both low). To start the serial output operation, the controller puts the TAP controllers 104 of the TAPIOs 416 in the Run Test/Idle state, disables its TCK output buffer 1208, and outputs TMS clocks to the TAPIO of core 1404. The TAPIO of core 1404 responds by enabling 3-state buffer 710 via Out signal 1203 and outputting data from its TCK terminal to the TCK terminal of controller 420.

The data flow is shown by the dotted line and passing through darkened buffers. The 3-state buffer 710 of core 1406 is disabled during the serial output operation from core 1404. At the end of the serial output operation, the TAPIO of core 1404 disables the 3-state output buffer 710 to allow the controller to regain drive control of the TCK signal path. This method of serial communication allows data from an embedded core's TAPIO to be quickly transferred to a controller 420.

Figure 14C:
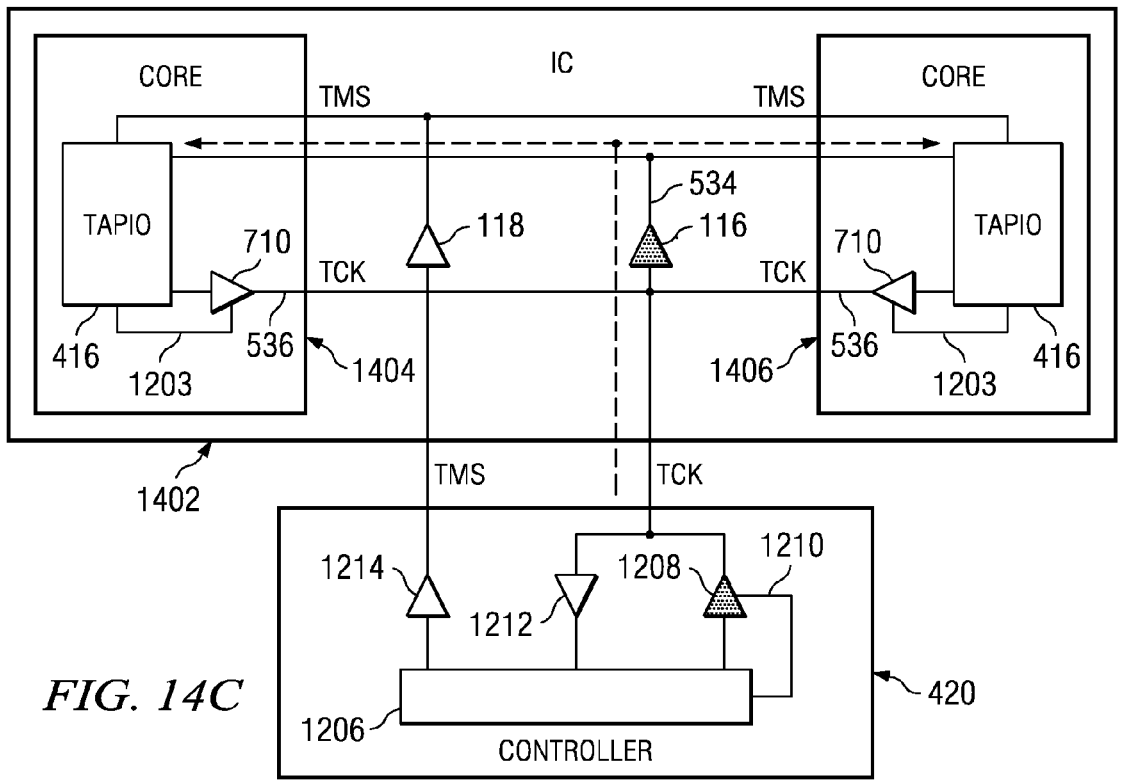
FIG. 14C illustrates a controller communicating to two embedded core circuits in an IC according to the present disclosure.

In FIG. 14C, the TAPIOs of cores 1404 and 1406 have both been set by a JTAG scan from controller 420 to perform a serial input operation (IE high and OE low) from controller 420 according to the present disclosure. During the serial input operation, the controller puts the TAP controllers 104 of the TAPIOs 416 in the Run Test/Idle state and outputs TMS clocks and TCK data to the TAPIOs of cores 1404 and 1406.

The flow of data from the TCK terminal of controller 420 to the TAPIOs of cores 1404 and 1406 is shown in dotted line and passing through darkened buffers. As seen the 3-state buffer 710 of cores 1404 and 1406 are disabled via Out signals 1203 during the serial input operation to allow the controller to input data to the TAPIOs of both cores via the TCK path.

FIG. 14C illustrates that a controller 420 can perform a serial input operation to a plurality of embedded core TAPIOs simultaneously. Each TAPIO will receive the same serial data input frames from the controller 420. This method of serial communication allows data from a controller 420 to be quickly transferred to a plurality of core TAPIOs at the same time. For example, this method of serial communication could be used quickly to upload common data frames to multiple TAPIOs 416 to enable parallel test, debug, trace, emulation, in-system-programming, or functional operations in multiple cores. Use of the parallel serial input method to the plural embedded cores of FIG. 14C is similar to that described for the plural ICs in FIG. 12C in regard to shift register 702 bit length and frame counts.

Figure 14D:
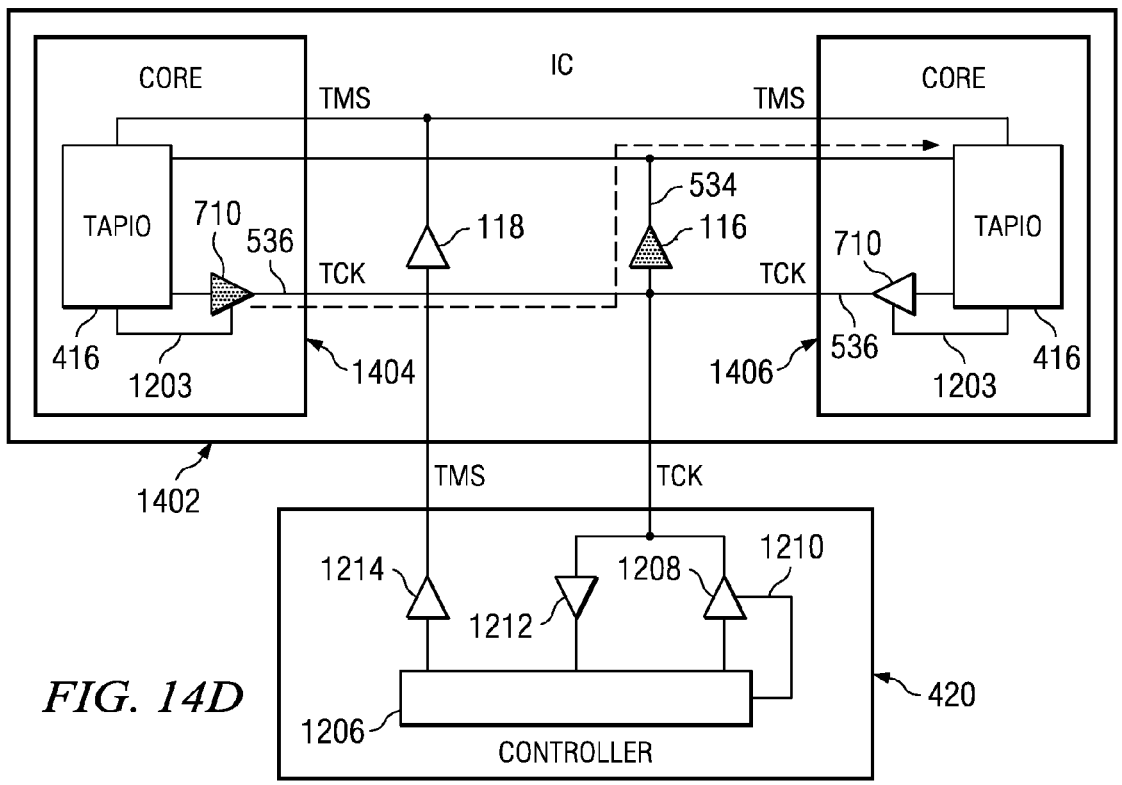
FIG. 14D illustrates one embedded core circuit in an IC communicating to another embedded core circuit in the IC according to the present disclosure.

In FIG. 14D, the TAPIO 416 of core 1404 has been set by a JTAG scan from controller 420 to perform a serial output operation (IE low and OE high) and the TAPIO 416 of core 1406 has been set by the JTAG scan operation to perform a serial input operation (IE high and OE low) according to the present disclosure. With this setting the TAPIO of core 1404 becomes a transmitter for outputting data on it TCK output terminal and the TAPIO of core 1406 becomes a receiver for inputting data from its TCK input terminal.

During the serial operations, the controller puts the TAP controllers 104 of the TAPIOs in the Run Test/Idle state, disables its TCK output buffer 1208, and outputs TMS clocks to the TAPIOs of cores 1404 and 1406. The flow of data from the TCK output terminal of core 1404 to the TCK input terminal of core 1406 is shown in dotted line and passing through darkened buffers. When the core to core data communication has been completed, the TAPIO of core 1404 disables its 3-state buffer 710 to allow the controller 420 to regain control of the TCK signal path. Similar core to core communication can occur from core 1406 to core 1404 by simply reversing the transmitter and receiver roles of the TAPIOs. This method of serial communication allows data from one embedded core's TAPIO to be quickly transferred to another embedded core's TAPIO.

Figure 15:
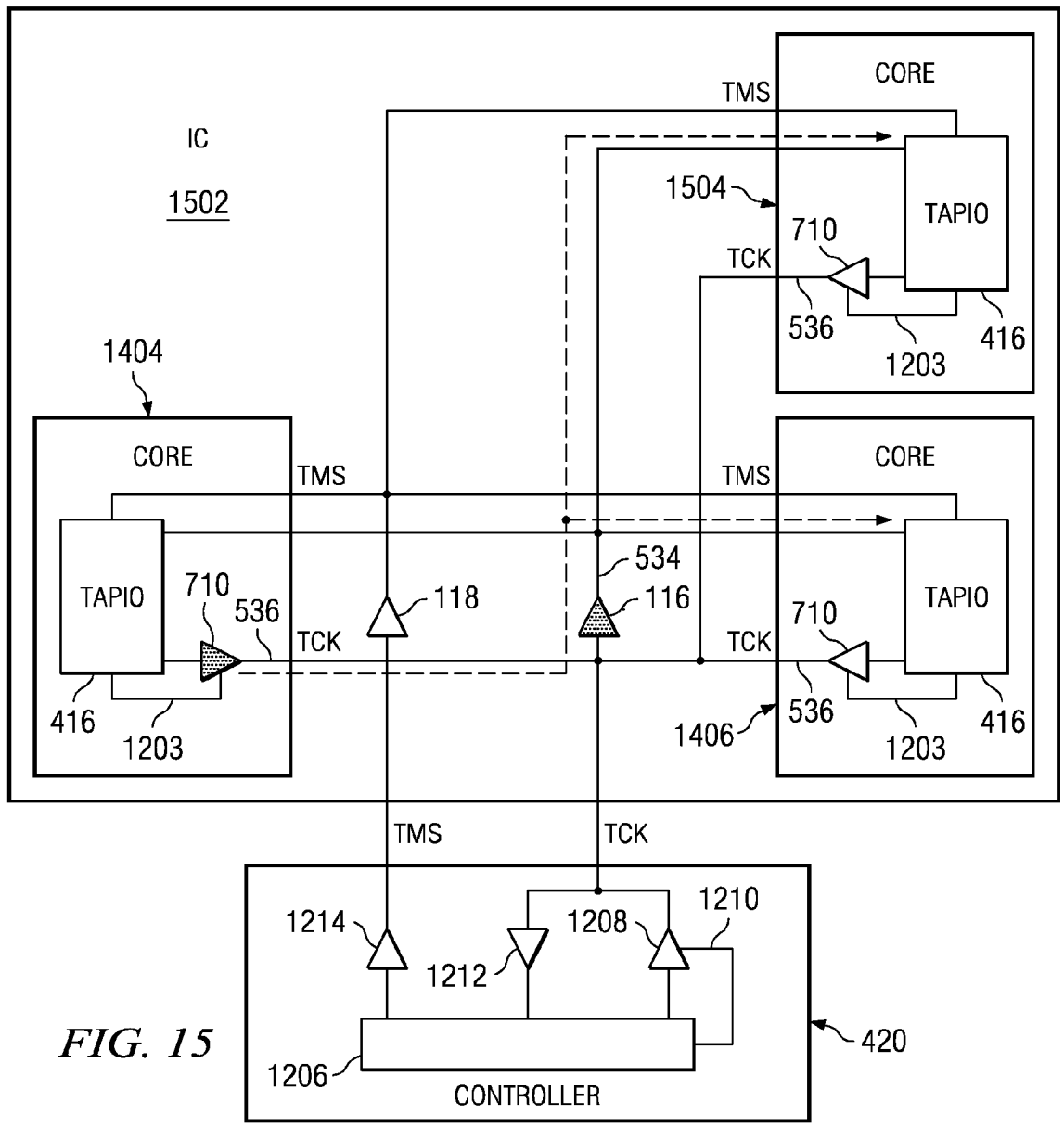
FIG. 15 illustrates one embedded core circuit in an IC communicating to two other embedded core circuits in the IC according to the present disclosure.

FIG. 15 illustrates a system with a controller 420 coupled to TAPIOs 416 of embedded cores 1404, 1406, and 1504 in an IC 1502 via TCK and TMS. In FIG. 15, the TAPIO of core 1404 has been set by a JTAG scan from controller 420 to perform a serial output operation (IE low and OE high) and the TAPIOs of cores 1406 and 1504 have been set by the JTAG scan operation to perform a serial input operation (IE high and OE low) according to the present disclosure.

With this setting the TAPIO of core 1404 becomes a transmitter for outputting data on its TCK output terminal and the TAPIOs of cores 1406 and 1502 become receivers for inputting data from their TCK input terminals. During the serial operations, the controller puts the TAP controllers 104 of the TAPIOs in the Run Test/Idle state, disables its TCK output buffer 1208, and outputs TMS clocks to the TAPIOs of cores 1404, 1406, and 1504. The flow of data from the TCK output terminal of core 1404 to the TCK input terminals of cores 1406 and 1504 is shown in dotted line and passing through darkened buffers.

When the single core to multiple core data communication has been completed, the TAPIO of core 1404 disables its 3-state buffer 710 to allow the controller 420 to regain control of the TCK signal path. FIG. 15 simply illustrates that a TAPIO of one embedded core can communicate data to a plurality of TAPIOs in other embedded cores. As with the plural data communication described in regard to FIG. 12C, the frame counters of the receiving TAPIOs of cores 1406 and 1504 can be set to the same or different frame counts. The frame counter of the transmitting TAPIO of core 1404 will be set to a frame count equal to the largest frame count loaded into the receiving TAPIOs. This method of serial communication allows data from one embedded core's TAPIO to be quickly transferred to a plurality of other embedded core TAPIOs.

When a TAPIO is transmitting data frames to another TAPIO, as shown in FIGS. 12D, 13, 14D, and 15, the receiving TAPIO has to be synchronized with the transmitting TAPIO using the previously mentioned I/O Sync signal 526 and Sync Circuit 528 of FIG. 5. Referring back to FIG. 5 it is seen that if the I/O Sync signal is set to a logic one, the Sync Circuit 528 delays the output of the Input Enable signal to the Serial I/O Circuit 516 when the TAP controller 104 enters the Run Test/Idle state (RTI goes high) until after the first rising edge of the TMS clock occurs. Thus, by setting the I/O Sync signal high, the serial input operation of a receiving TAPIO may be delayed from starting by one TMS clock input.

By delaying the start of the serial input operation of the receiving TAPIO by one TMS clock, the transmitting TAPIO is given time to perform its shift register 702 load operation. Following the shift register load operation, both the transmitting and receiving TAPIOs start their shift out and shift in operation, respectively, on the same TMS clock input. Once started, the TAPIOs operate in sync with one another to transmit and receive same length data frames.

Figure 16:
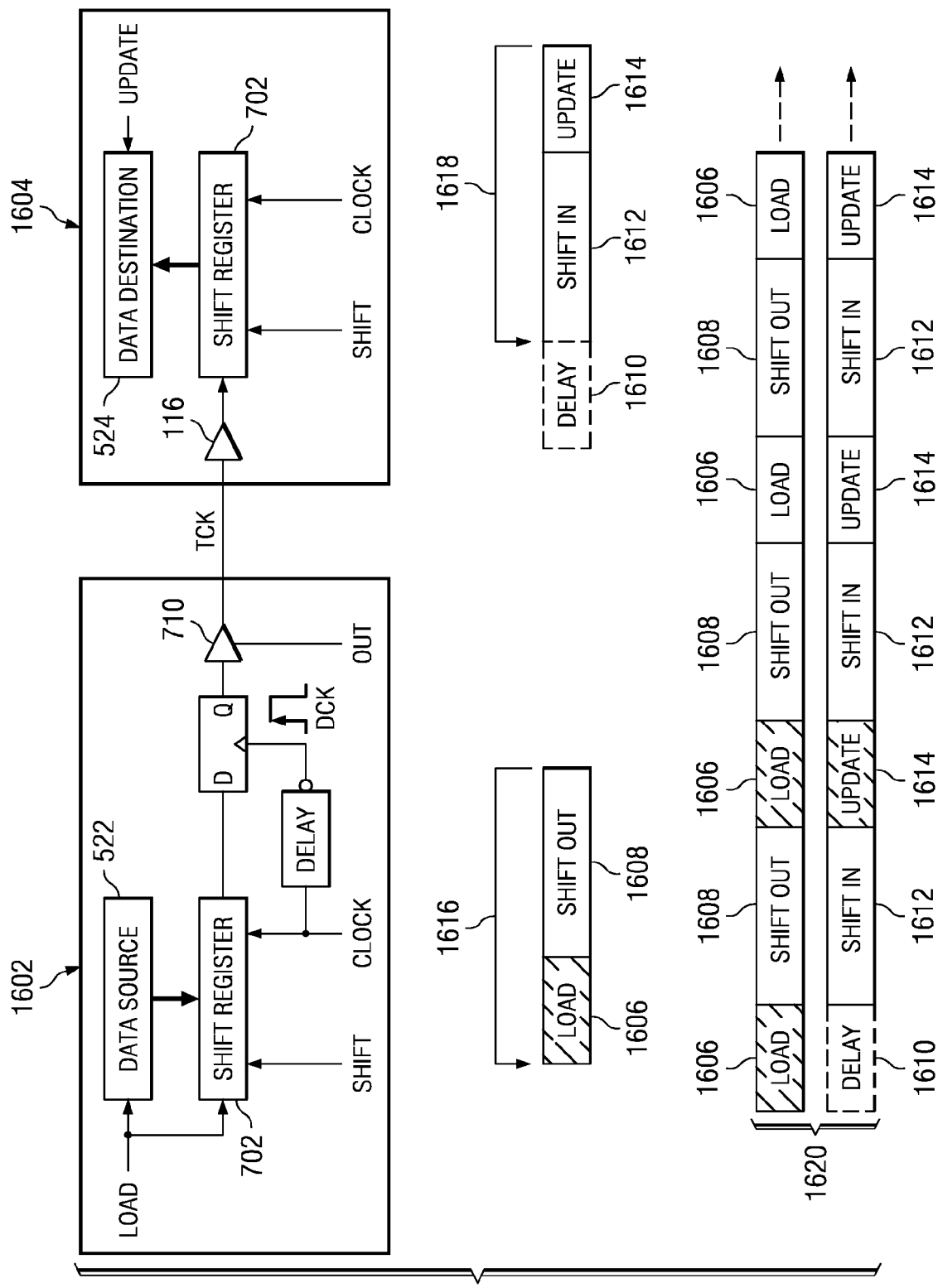
FIG. 16 illustrates serial input and output data frame synchronization occurring between a transmitting IC or core circuit and a receiving IC or core circuit according to the present disclosure.

FIG. 16 illustrates the transmitting circuitry of a TAPIO 1602 in an IC or core starting up a communication session with the receiving circuitry of another TAPIO 1604 in an IC or core. In this example the shift registers 702 of the transmitting 1602 and receiving 1604 TAPIOs are of the same bit length. The I/O Sync signal 526 of the receiving TAPIO 1604 has been set high to delay the start of the shift in operation of TAPIO 1604 by one TMS clock input, via the Sync Circuit 528.

As seen in the "Load/Shift Out" operation 1616 of the transmitting TAPIO 1602 and "Shift In/Update" operation 1618 of the receiving TAPIO 1604, the start of the first "Shift In" portion 1612 of the "Shift In/Update" operation 1618 is Delayed at 1610 until after the "Load" portion 1606 of the first "Load/Shift Out" 1616 operation has been performed. Thus the receiving TAPIO 1604 is forced by the I/O Sync signal 526 and Sync Circuit 528 to delay its "Shift In" operation until the transmitting TAPIO begins its "Shift Out" operation. As seen in the overlayed TAPIO 1602 and 1604 operation example 1620, after the initial TAPIO 1604 Delay at time 1610 the operations of the transmitting and receiving TAPIOs are synchronized, such that when TAPIO 1602 shifts out at 1608, TAPIO 1604 shifts in at 1612, and when TAPIO 1602 Loads at 1606, TAPIO 1604 Updates at 1614.

Figure 17:
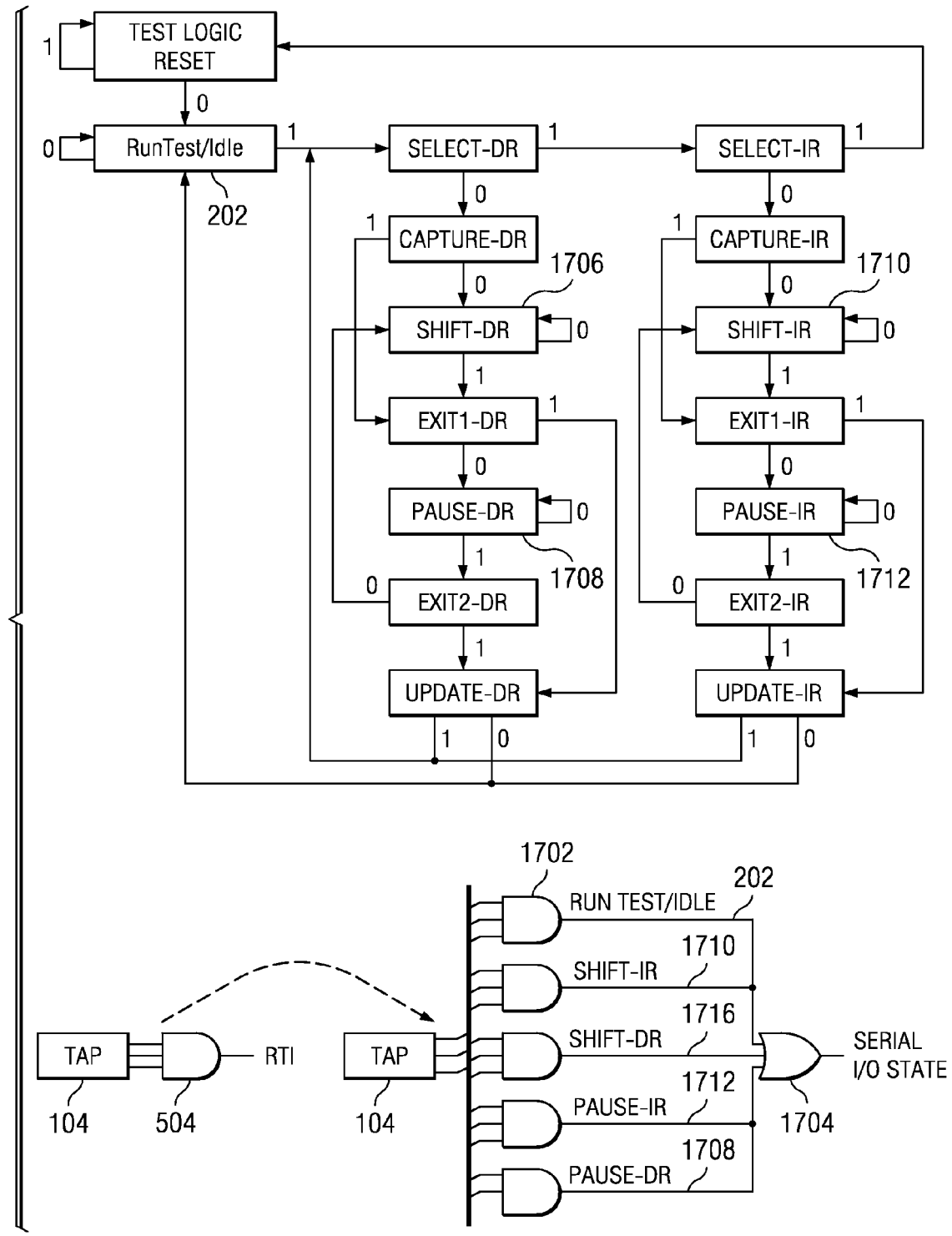
FIG. 17 illustrates additional TAP controller states in which the serial input and output operations of the present disclosure may be executed.

FIG. 17 is provided to illustrate that other TAP controller states, in addition to the Run Test/Idle state, may be used to perform serial input and output operations according to the disclosure. For example, the Shift-IR state, the Shift-DR state, the Pause-IR state, and the Pause-DR state may be used along with the Run Test/Idle state as steady states in which serial input or output operations may be performed.

To use these additional TAP controller steady states to enable the serial input and output operations of the disclosure is simply a matter of providing AND gates 1702 to detect when the TAP controller is in one of the states, as AND gate 504 did for detecting the Run Test/Idle state, and providing an OR gate 1704 for indicating when any of the AND gates 1702 outputs are high. The Serial I/O State output of OR gate 1704 would be substituted for the RTI output of AND gate 504 in FIG. 5 and input to And gates 506 and 508.

With this substitution made, the TAP controller 104 could be transitioned into any one of these steady states, and held there by adhering to the TCK and TMS signal timing restrictions described in FIGS. 6B and 6C, to allow a serial input or output operation to be started, executed, and stopped, as was described in regard to the Run Test/Idle state of FIG. 6A.

While it is possible to use the Shift-DR and Shift-IR states as steady states for the serial input or output operations of the present disclosure, one must be aware that data will be shifting through the TAP Domains of the ICs/cores in the JTAG scan path from TDI to TDO, since the data transitions occurring on the TCK signal during serial input or output operations will be seen as TCK clocks for shifting data or instruction on the TDI and TDO scan path. This may or may not be a desired situation and is therefore left up to the user of the disclosure to determined whether or not the Shift-IR and Shift-DR states should be used as steady states for use by the present disclosure.

Figure 18:
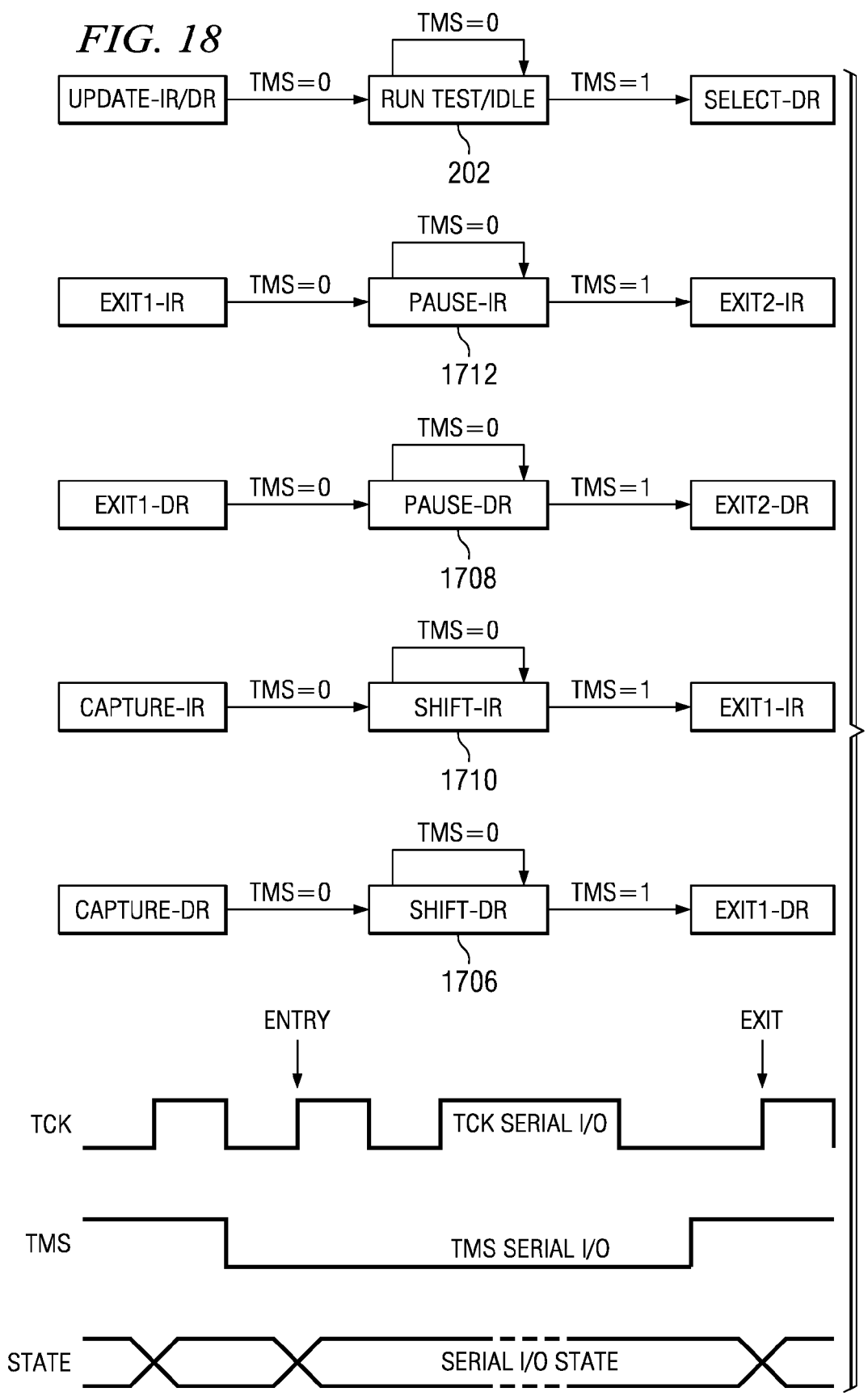
FIG. 18 illustrates the execution of the serial input and output operations of the present disclosure in the additional TAP controller states of FIG. 17.

FIG. 18 illustrates each of the TAP controller 104 states of FIG. 17 being used as steady states to enable the serial input or output operation of the present disclosure. By adhering to the TCK and TMS timing restrictions described in FIGS. 6B and 6C, the TAP controller will remain in each of the these states while TCK and TMS Serial I/O operations take place.

Although the present disclosure has been described in detail, it should be understood that various changes, substitutions, and alterations may be made without departing from the spirit and scope of the disclosure as defined by the appended claims.

What is claimed is:

1. An electrical device comprising:
   A. a TDI lead, a TDO lead, a TMS lead, and a TCK lead;
   B. test access port circuitry having a TDI input coupled to the TDI lead, a TDO output coupled to the TDO lead, a TMS input coupled to the TMS lead, and a TCK input coupled to the TCK lead, the test access port circuitry providing as output signals an enable serial input signal, an input/output sync signal, and a Run Test/Idle signal;
   C. a logic gate having one input connected to the enable serial input signal, another input connected to the Run Test/Idle output signal, and an output; and
   D. sync circuitry having a first input connected to the output of the logic gate, a second input connected to the input/output sync signal, a clock input coupled to the TMS lead, and an input enable output.

2. The device of claim 1 in which the test access port circuitry includes an instruction register and a data register, both connected to the TDI input, and the test access port circuitry provides the enable serial input signal from one of the instruction register and the data register.

3. The device of claim 1 in which the test access port circuitry includes an instruction register and a data register, both connected to the TDI input, and the test access port circuitry provides the input/output sync signal from one of the instruction register and the data register.

4. The device of claim 1 in which the test access port circuitry includes controller circuitry having outputs indicating states and logic circuitry having inputs connected to the state outputs of the controller circuitry and having an output providing the Run Test/Idle signal.

* * * * *